United States Patent
Kawaminami

(10) Patent No.: US 10,438,933 B2
(45) Date of Patent: Oct. 8, 2019

(54) SEMICONDUCTOR DEVICE AND MANUFACTURING METHOD OF SEMICONDUCTOR DEVICE

(71) Applicant: FUJITSU LIMITED, Kawasaki-shi, Kanagawa (JP)

(72) Inventor: Hironori Kawaminami, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/927,122

(22) Filed: Mar. 21, 2018

(65) Prior Publication Data

US 2018/0308826 A1 Oct. 25, 2018

(30) Foreign Application Priority Data

Apr. 19, 2017 (JP) .................. 2017-083180

(51) Int. Cl.
| | | |
|---|---|---|
| H01L 25/10 | (2006.01) | |
| H01L 25/00 | (2006.01) | |
| H01L 23/528 | (2006.01) | |
| H03K 5/15 | (2006.01) | |
| H01L 23/48 | (2006.01) | |
| H01L 23/498 | (2006.01) | |

(52) U.S. Cl.
CPC .......... *H01L 25/105* (2013.01); *H01L 23/481* (2013.01); *H01L 23/49816* (2013.01); *H01L 23/528* (2013.01); *H01L 25/50* (2013.01); *H03K 5/15026* (2013.01); *H01L 2224/16225* (2013.01); *H01L 2225/1058* (2013.01)

(58) Field of Classification Search
CPC .... H03K 3/012; H03K 3/037; H03K 19/0016; H03K 19/20; H03K 19/21; H03K 21/38; H03K 21/40; H03K 5/133; H03K 5/19
See application file for complete search history.

(56) References Cited

U.S. PATENT DOCUMENTS

| | | | |
|---|---|---|---|
| 9,153,557 B2 | 10/2015 | Sung et al. | |
| 9,825,006 B2 | 11/2017 | Miki | |
| 2005/0007171 A1* | 1/2005 | Yoneda | ................ H03K 5/1252 327/199 |
| 2007/0023887 A1 | 2/2007 | Matsui | |

(Continued)

FOREIGN PATENT DOCUMENTS

| | | |
|---|---|---|
| JP | 2004-022610 | 1/2004 |
| JP | 2007-036104 | 2/2007 |
| JP | 2008-251666 | 10/2008 |

(Continued)

OTHER PUBLICATIONS

U.S. Office Action dated Oct. 10, 2018 for copending U.S. Appl. No. 15/927,115, 14 pages.

(Continued)

*Primary Examiner* — John W Poos
(74) *Attorney, Agent, or Firm* — Fujitsu Patent Center

(57) ABSTRACT

A semiconductor device includes: a first semiconductor die and a second semiconductor die connected on the first semiconductor die, in which the first semiconductor die includes buffers in a second-stage configuration to an Nth-stage configuration (N being an integer of 3 or more) in a clock tree structure, and the second semiconductor die includes a logic circuit electrically connected to the buffer in the Nth-stage configuration.

18 Claims, 28 Drawing Sheets

(56) References Cited

U.S. PATENT DOCUMENTS

| 2008/0122501 | A1* | 5/2008 | Narusawa | G06F 1/12 327/144 |
| 2010/0044846 | A1* | 2/2010 | Ohmi | H01L 21/8221 257/686 |

FOREIGN PATENT DOCUMENTS

| JP | 2009-027068 | 2/2009 |
| JP | 2010-073771 | 4/2010 |

OTHER PUBLICATIONS

U.S. Office Action dated Jun. 5, 2019 for co-pending U.S. Appl. No. 15/921,115, 9 pages.

U.S. Office Action dated Feb. 14, 2019 for copending U.S. Appl. No. 15/927,115, 13 pages.

* cited by examiner

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority of the prior Japanese Patent Application No. 2017-083180, filed on Apr. 19, 2017, the entire contents of which are incorporated herein by reference.

FIELD

The embodiments discussed herein are directed to a semiconductor device and a manufacturing method of a semiconductor device.

BACKGROUND

In recent years, the semiconductor technical field has been said that miniaturization (scaling) comes to have its limitations, and an improvement in performance not relying on the miniaturization has been desired in the future. Examples of such a high-density packaging technology not relying on the miniaturization include a three-dimensional packaging technology in which stacking of semiconductor dies is performed. When semiconductor dies are packaged three-dimensionally, it has been conducted conventionally that a logic circuit whose power consumption is higher than that of a memory circuit is arranged in a semiconductor die being the lowermost layer, and on top of the semiconductor die, a low power semiconductor die such as a memory circuit is arranged.

[Patent Document 1] Japanese Laid-open Patent Publication No. 2007-36104

[Patent Document 2] Japanese Laid-open Patent Publication No. 2008-251666

As scaling of semiconductor devices progresses, the cell size reduces, but it is difficult to reduce the wiring size to the cell size. Even in the three-dimensional packaging, as scaling is performed, the congestion of wirings increases. An increase in wiring congestion fails to secure a wiring region, and thus some wirings have to make a detour, resulting in that the device performance and the manufacturing yield are adversely affected. Further, a high-performance processor operates at a high frequency of several GHz, and thus the logic circuit is affected by crosstalk or the like caused by a clock signal in the semiconductor die. The effect of this crosstalk or the like on signal integrity is very large, and in order to prevent this effect, it is necessary to provide a shield wiring in the periphery of a clock wiring. Therefore, the wiring congestion further worsens to thus affect the device performance and the manufacturing yield.

SUMMARY

According to one aspect, a semiconductor device includes a first semiconductor that includes, in a clock tree with buffers connected in plural stages, the buffers each supplying a clock signal to a logic circuit provided in the semiconductor device, the second-stage buffer to the Nth-stage buffer (N being an integer of 3 or more); and a second semiconductor that includes a logic circuit electrically connected to the Nth-stage buffer.

According to one aspect, a manufacturing method of a semiconductor device includes: forming a first semiconductor that includes, in a clock tree with buffers connected in plural stages, the buffers each supplying a clock signal to a logic circuit provided in the semiconductor device, the second-stage buffer to the Nth-stage buffer (N being an integer of 3 or more); stacking a second semiconductor that includes a logic circuit electrically connected to the Nth-stage buffer on the first semiconductor; and connecting the Nth-stage buffer to the logic circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, there will be explained in detail various embodiments of a semiconductor device having a three-dimensional packaging technology applied thereto and a manufacturing method of a semiconductor device with reference to the drawings.

First Embodiment (Semiconductor Device Configuration)

Figure 1:
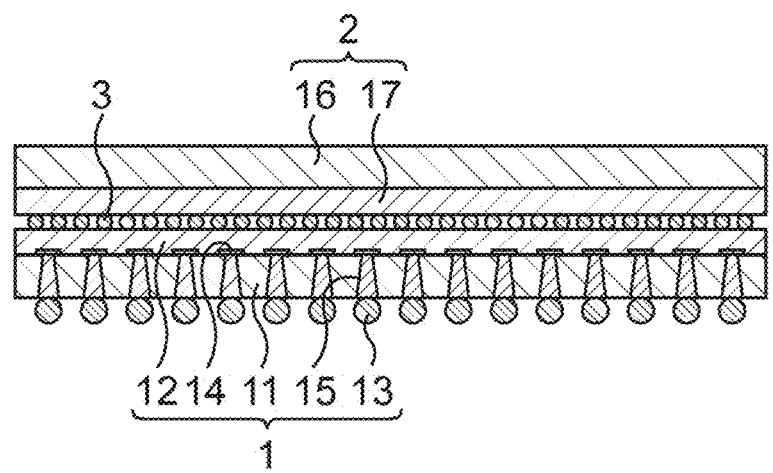
FIG. 1 is a schematic cross-sectional view illustrating a configuration of a semiconductor device according to a first embodiment.

FIG. 1 is a schematic cross-sectional view illustrating a configuration of a semiconductor device according to a first embodiment.

The semiconductor device includes: a first semiconductor die 1 being a bottom (Bottom) die; and a second semiconductor die 2 being a top (Top) die stacked on the first semiconductor die 1, and the first semiconductor die 1 and the second semiconductor die 2 are connected by bumps 3 such as micro-bumps. The first semiconductor die 1 and the second semiconductor die 2 are connected Face to Face.

Figure 2:
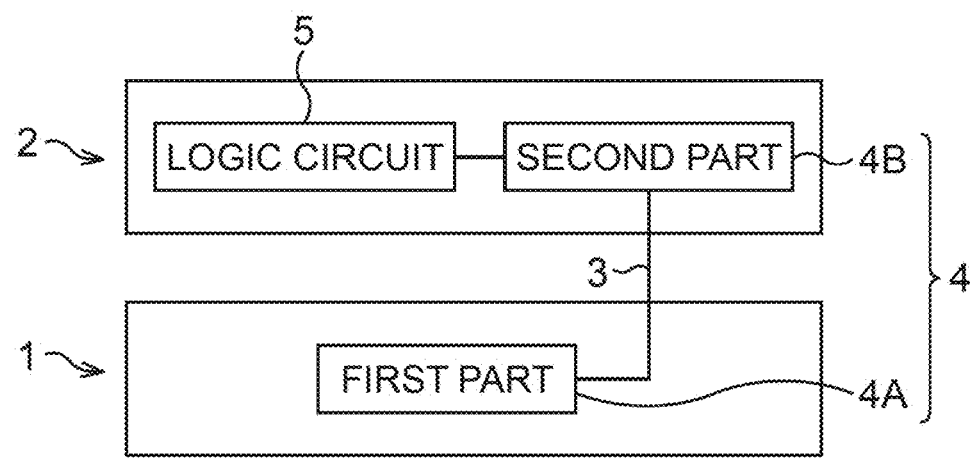
FIG. 2 is a schematic view illustrating the relationship between a clock tree structure and a logic circuit included in the semiconductor device according to the first embodiment.

FIG. 2 is a schematic view illustrating the relationship between a logic circuit included in the semiconductor device according to the first embodiment and a clock tree structure that supplies a clock signal to a flip-flop circuit included in the logic circuit.

The semiconductor device according to this embodiment includes: a clock tree structure 4 including a first part 4A and a second part 4B; and a logic circuit 5 such as a flip-flop circuit. The first part 4A being the main configuration of the clock tree structure 4 is arranged in the first semiconductor die 1, and the second part 4B being the remaining configuration of the clock tree structure 4 and the logic circuit 5 are arranged in the second semiconductor die 2. The logic circuit 5 is electrically connected to the second part 4B by a wiring 6. The clock tree structure 4 is configured by the first part 4A and the second part 4B being electrically connected via the bumps 3.

As illustrated in FIG. 1, the first semiconductor die 1 includes: a first semiconductor substrate 11; a first element formation layer 12 formed on the first semiconductor substrate 11; and bumps 13 such as C4 bumps formed on a lower surface (rear surface) of the first semiconductor substrate 11.

The first element formation layer 12 includes: a first part of a clock circuit; a power supply wiring; a signal wiring; and so on. Connection pads 14 connected to the power supply wiring are provided at a lowermost portion of the first element formation layer 12.

Figure 3:
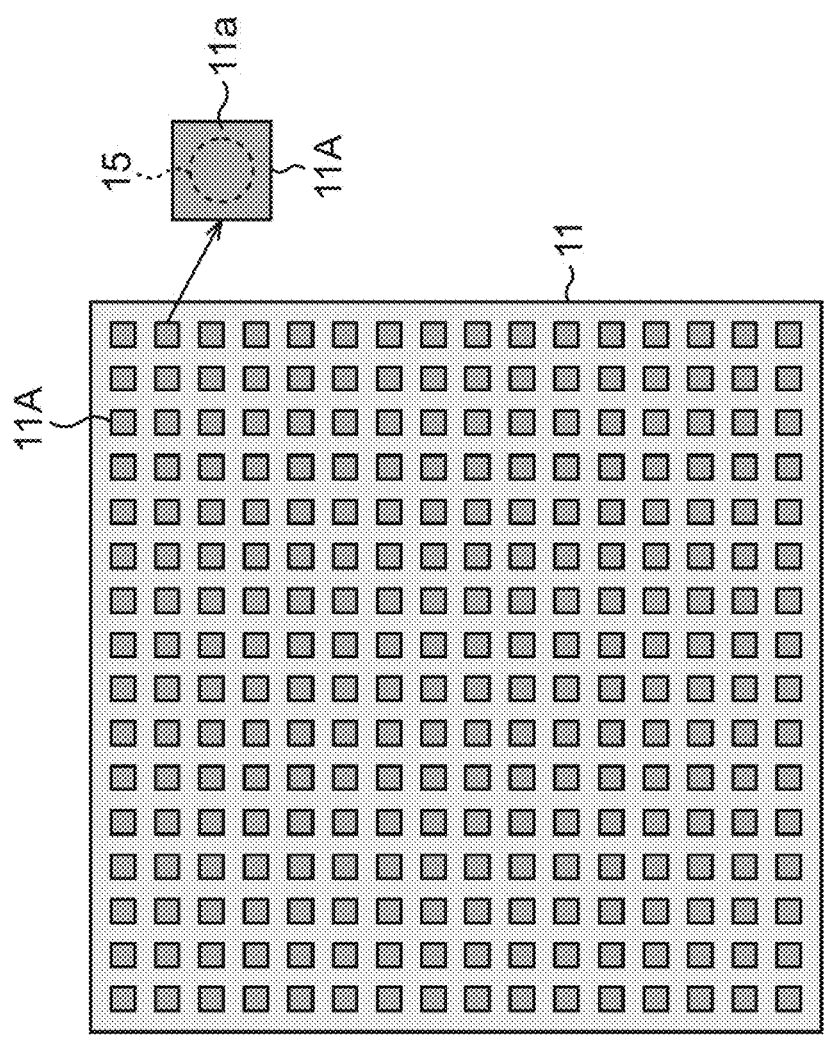
FIG. 3 is a schematic plan view illustrating through electrodes of a semiconductor die of the semiconductor device according to the first embodiment.

The first semiconductor substrate 11 includes through electrodes 15 such as TSVs (Through Silicon Vias) that penetrate the first semiconductor substrate 11 to be connected to the connection pards 14 on an upper surface (front surface). In the semiconductor substrate 11, as illustrated in FIG. 3, a plurality of electrode regions 11A are uniformly arranged over the entire lower surface (rear surface) of the semiconductor substrate 11. In the example in FIG. 3, the plural electrode regions 11A are each uniformly arranged at regular intervals over the entire rear surface of the semiconductor substrate 11. The through electrode 15 is provided in each of the electrode regions 11A, and each peripheral portion around the through electrode 15 in the electrode region 11A is a cell arrangement prohibiting region 11a. The bumps 13 are connected to the through electrodes 15 on the lower surface of the first semiconductor substrate 11.

The second semiconductor die 2 includes: a second semiconductor substrate 16; and a second element formation layer 17 formed on the second semiconductor substrate 16 (under the second semiconductor substrate 16 in FIG. 1). The second element formation layer 17 is connected to the first element formation layer 11 by the bumps 3.

The second element formation layer 17 includes: a logic circuit; a second part of the clock circuit; a wiring connecting the second part and the logic circuit; and so on.

Figure 4:
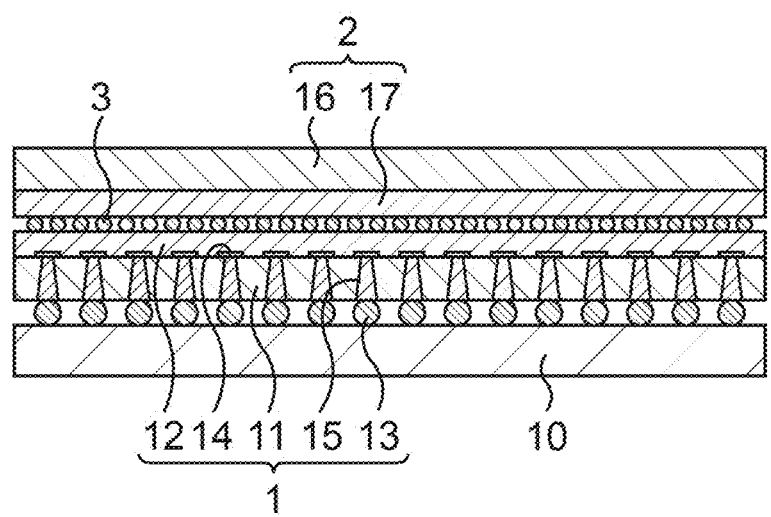
FIG. 4 is a schematic cross-sectional view illustrating a configuration of a stacked semiconductor device according to the first embodiment.

As illustrated in FIG. 4, this semiconductor device is connected on a package substrate 10 by the bumps 13, to thereby configure a stacked semiconductor device. Power is supplied to the semiconductor device from the package substrate 10 through the through electrodes 15.

Figure 5:
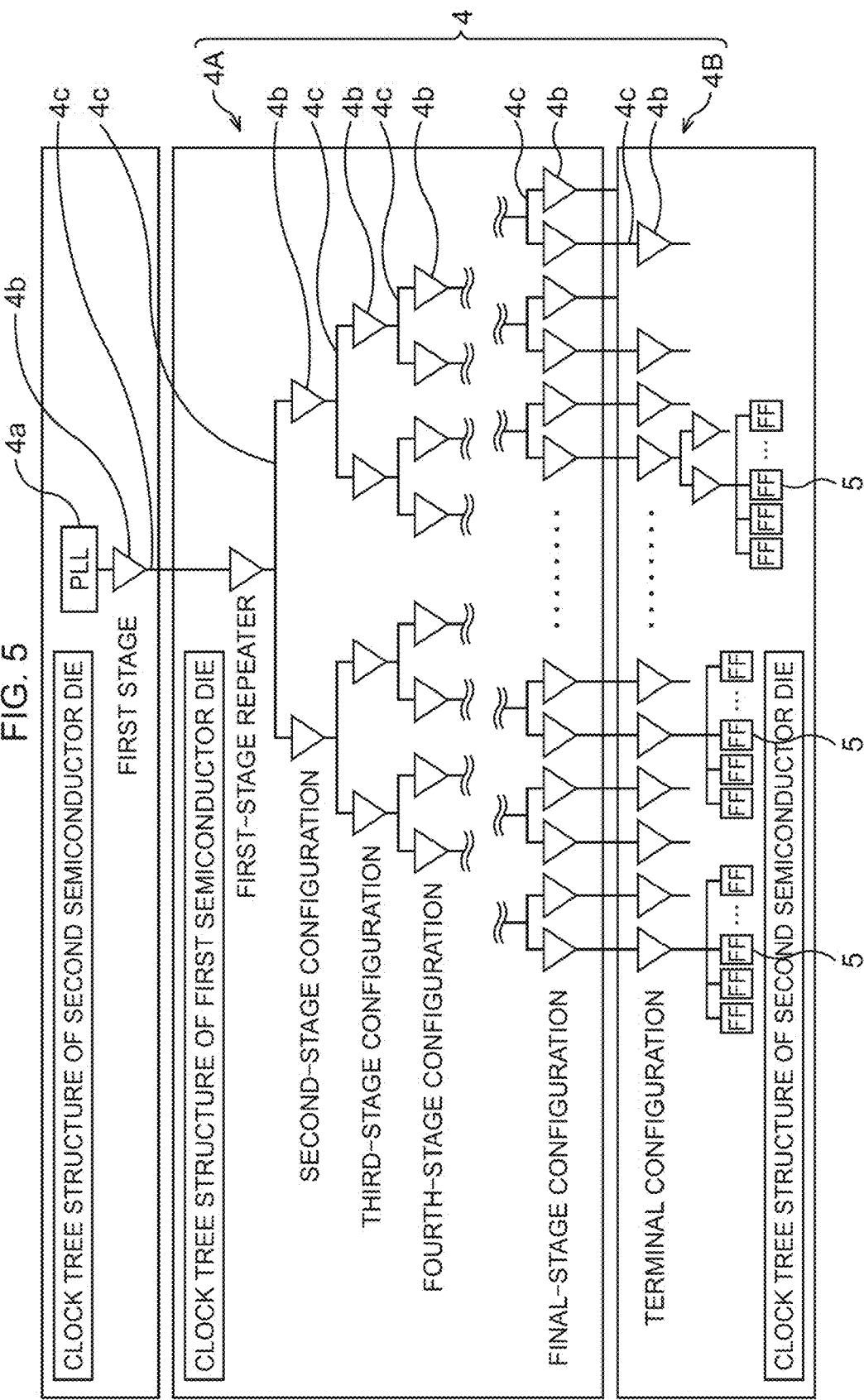
FIG. 5 is a schematic view illustrating a concrete configuration of the clock tree structure in the semiconductor device according to the first embodiment and flip-flop circuits connected to the clock tree structure.
Figure 6:
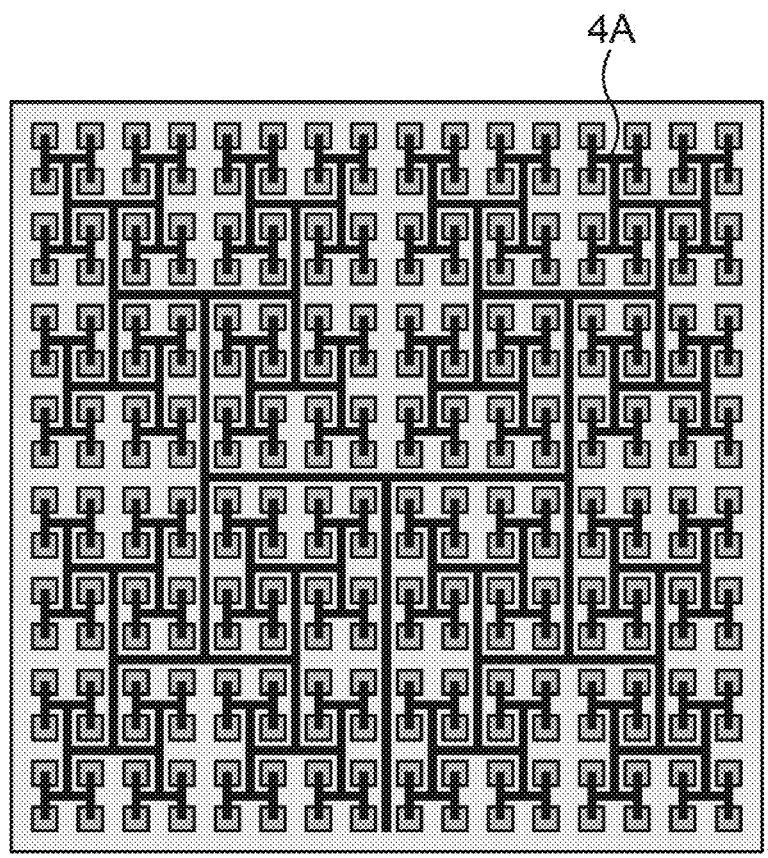
FIG. 6 is a schematic plan view illustrating clock wirings of the clock tree structure in the semiconductor device according to the first embodiment.

FIG. 5 is a schematic view illustrating a concrete configuration of the clock tree structure in the semiconductor device according to the first embodiment and flip-flop circuits connected to the clock tree structure. FIG. 6 is a schematic plan view illustrating clock wirings of the clock tree structure.

The clock tree structure 4 is referred to as an equal-length wiring structure of what is called an H tree, and includes a PLL (Phase Locked Loop) circuit 4a, and buffer circuits 4b and clock wirings 4c configuring respective stages. In the clock tree structure 4, the first-stage configuration is configured of the single buffer circuit 4b and the clock wiring 4c. The second-stage configuration is configured of the two buffer circuits 4b resulting from the first-stage configuration branching into two, for example, and the clock wirings 4c. The third-stage configuration is configured of the four buffer circuits 4b resulting from the buffer circuits 4b of the second-stage configuration each branching into two, for example, and the clock wirings 4c. In this manner, the final-stage configuration is configured of a predetermined number of the buffer circuits 4b resulting from the buffer circuits 4b of the previous-stage configuration each branching into two, for example, and the clock wirings 4c. In the example in FIG. 5, an arbitrary stage out of the second-stage configuration to the final-stage configuration is called an Nth-stage configuration (N being an integer of 3 or more). Further, a terminal structure is configured of the buffer circuits 4b connected to the respective buffer circuits 4b of the final-stage configuration, and the buffer circuits 4b and the clock wirings 4c to be connected to the logic circuits 5. The clock tree structure 4 is configured by including the PLL circuit 4a, the first-stage configuration to the final-stage configuration, and the terminal structure.

In this embodiment, at least the second-stage configuration to the Nth-stage configuration (all), in the example in FIG. 5, together with a first-stage repeater, the second-stage configuration to the final-stage configuration (all) are the first part 4A of the clock tree structure 4, and are provided in the first semiconductor die 1. The PLL circuit 4a, the first-stage configuration, and the terminal structure are the second part 4B of the clock tree structure 4, and are provided in the second semiconductor die 2 together with the logic circuits 5 connected to the terminal structure.

Figure 7:
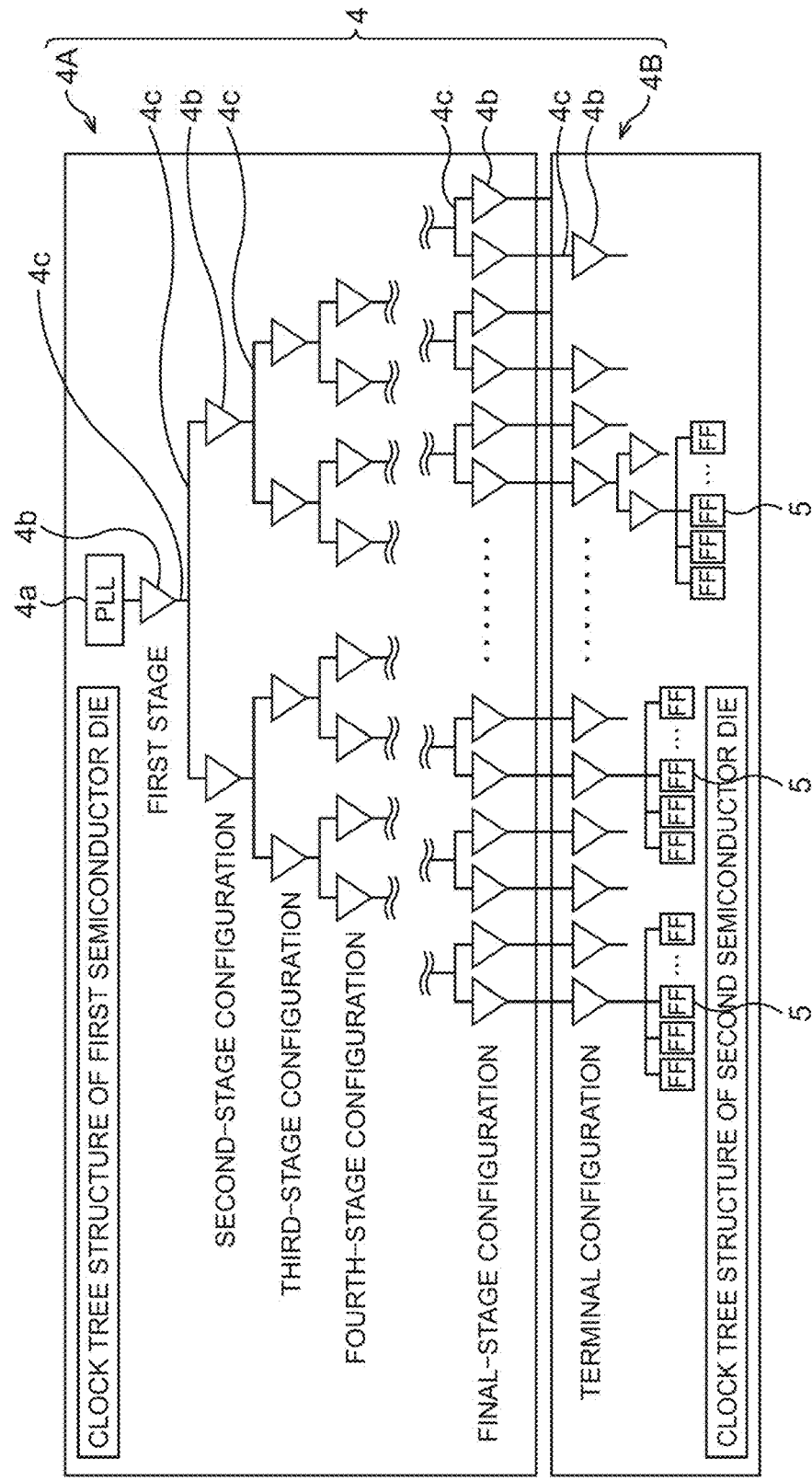
FIG. 7 is a schematic view illustrating another concrete configuration of the clock tree structure in the semiconductor device according to the first embodiment and the flip-flop circuits connected to the clock tree structure.

The clock tree structure 4 may be provided in the first semiconductor die and the second semiconductor die as illustrated in FIG. 7.

In this embodiment, at least the second-stage configuration to the Nth-stage configuration (all), in the example in FIG. 7, the PLL circuit 4a, and the first-stage configuration to the final-stage configuration (all) are the first part 4A of the clock tree structure 4, and are provided in the first semiconductor die 1. The terminal structure is the second part 4B of the clock tree structure 4, and is provided in the second semiconductor die 2 together with the logic circuits 5 connected to the terminal structure.

Figure 8:
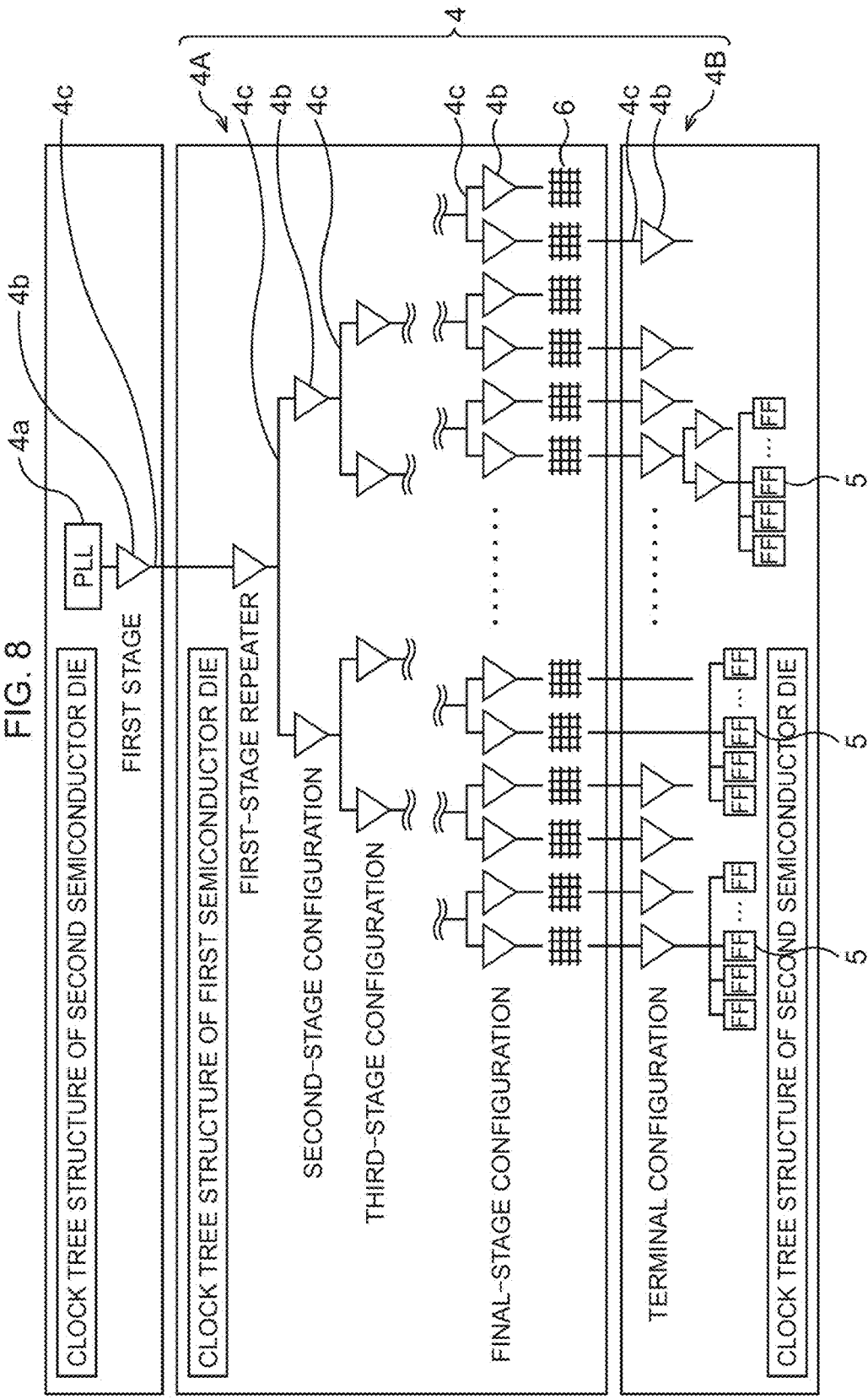
FIG. 8 is a schematic view illustrating a concrete configuration of a clock tree structure (including clock meshes) in the semiconductor device according to the first embodiment and the flip-flop circuits connected to the clock tree structure.
Figure 9:
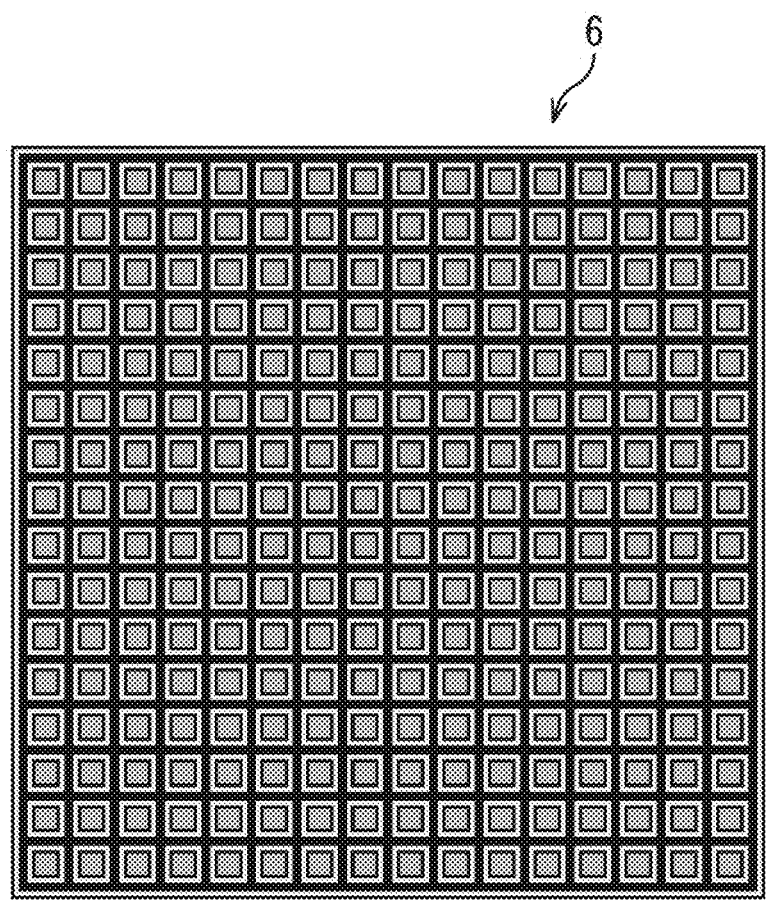
FIG. 9 is a schematic plan view illustrating clock wirings of the clock tree structure (including the clock meshes) in the semiconductor device according to the first embodiment.

FIG. 8 is a schematic view illustrating another concrete configuration of the clock tree structure in the semiconductor device according to the first embodiment and the flip-flop circuits connected to the clock tree structure. FIG. 9 is a schematic plan view illustrating a clock mesh in the clock tree structure.

A clock tree structure 4 is referred to as an equal-length wiring structure of what is called an H tree having an H-shaped branch structure, and includes a PLL circuit 4a, buffer circuits 4b and clock wirings 4c configuring respective stages, and clock meshes 6 each distributing a clock signal by mesh wirings. The first-stage configuration is configured of the single buffer circuit 4b and the clock wiring 4c. The second-stage configuration is configured of the two buffer circuits 4b resulting from the first-stage configuration branching into two, for example, and the clock wirings 4c. The third-stage configuration is configured of the four buffer circuits 4b resulting from the buffer circuits 4b of the second-stage configuration each branching into two, for example, and the clock wirings 4c. In this manner, the final-stage configuration is configured of a predetermined number of the buffer circuits 4b resulting from the buffer circuits 4b of the previous-stage configuration each branching into two, for example, and the clock wirings 4c. The buffer circuits 4b of the final-stage configuration and the clock meshes 6 are connected respectively. In the example in FIG. 8, an arbitrary stage out of the second-stage configuration to the final-stage configuration and to the clock meshes 6 is called an Nth-stage configuration (N being an integer of 3 or more). Further, a terminal structure is configured of the buffer circuits 4b connected to the respective clock meshes 6, and the buffer circuits 4b and the clock wirings 4c to be connected to the logic circuits 5. The clock tree structure 4 is configured by including the PLL circuit 4a, the first-stage configuration to the final-stage configuration, the clock meshes 6, and the terminal structure.

In this embodiment, at least the second-stage configuration to the Nth-stage configuration (all), in the example in FIG. 8, together with a first-stage repeater, the second-stage configuration to the final-stage configuration and the clock meshes 6 (all) are the first part 4A of the clock tree structure 4, and are provided in the first semiconductor die 1. The PLL circuit 4a, the first-stage configuration, and the terminal structure are the second part 4B of the clock tree structure 4, and are provided in the second semiconductor die 2 together with the logic circuits 5 connected to the terminal structure.

Figure 10:
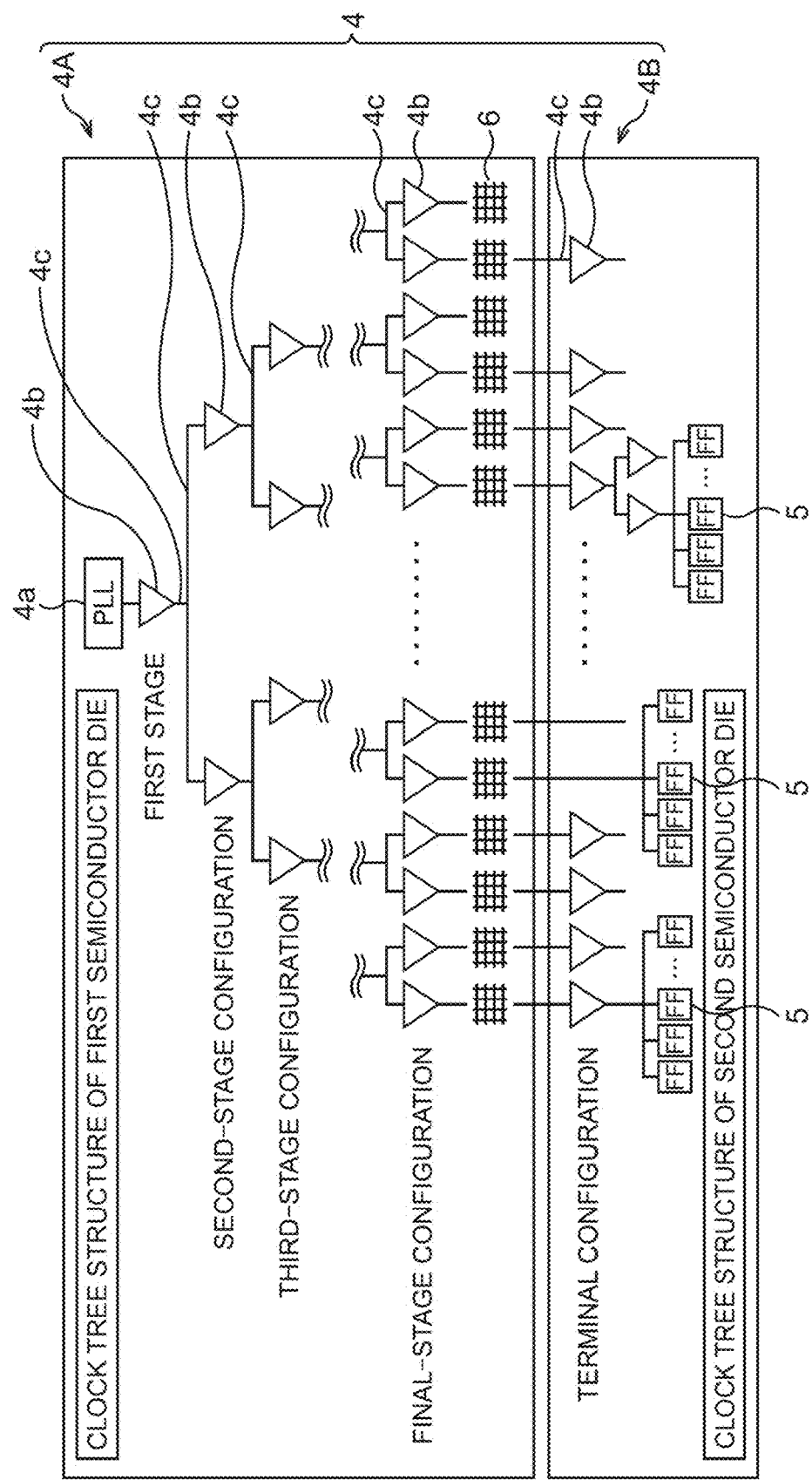
FIG. 10 is a schematic view illustrating another concrete configuration of the clock tree structure (including the clock meshes) in the semiconductor device according to the first embodiment and the flip-flop circuits connected to the clock tree structure.

The clock tree structure may be provided in the first semiconductor die and the second semiconductor die as illustrated in FIG. 10.

In this embodiment, at least the second-stage configuration to the Nth-stage configuration (all), in the example in FIG. 10, the PLL circuit 4a, and the first-stage configuration to the final-stage configuration, and the clock meshes 6 (all) are the first part 4A of the clock tree structure 4, and are provided in the first semiconductor die 1. The terminal structure is the second part 4B of the clock tree structure 4, and is provided in the second semiconductor die 2 together with the logic circuits 5 connected to the terminal structure.

As the clock tree structure, any structure can be employed other than the above-described respective configuration examples.

Figure 11:
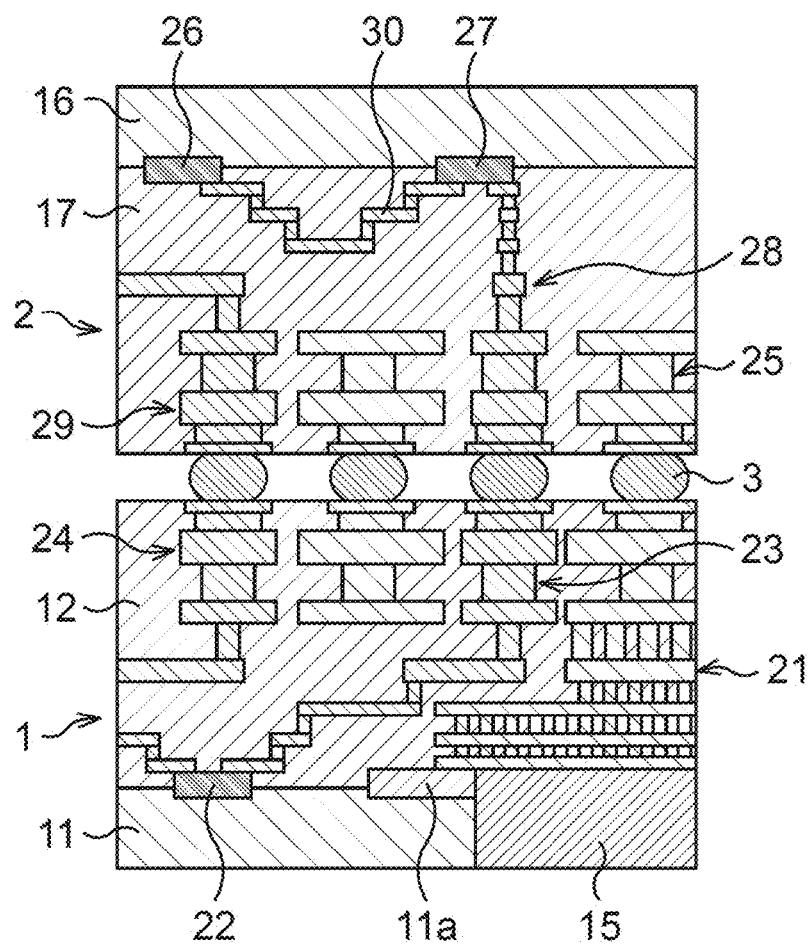
FIG. 11 is a schematic cross-sectional view illustrating a part of a physical configuration of the semiconductor device according to the first embodiment.

FIG. 11 is a schematic cross-sectional view illustrating a part of a physical configuration of the semiconductor device according to this embodiment.

In the first semiconductor die 1, a power supply wiring 21, the first part of the clock tree structure, and a signal wiring 24 are provided in the first element formation layer 12. In the example in FIG. 11, a clock macro 22 and a clock wiring 23 are illustrated representatively as the first part of the clock tree structure. The power supply wiring 21 is connected to the through electrodes 15. One end of the clock wiring 23 is connected to the clock macro 22.

In the second semiconductor die 2, a power supply wiring 25, the second part of the clock tree structure, a signal wiring 29, and a clock wiring 30 are provided in the second element formation layer 17. In the example in FIG. 11, a flip-flop circuit 26, a clock macro 27, a clock wiring 28, and the wiring 30 are illustrated representatively as the second part of the clock tree structure. The wiring 30 connects the flip-flop circuit 26 and the clock macro 27.

Between the first semiconductor die 1 and the second semiconductor die 2, the power supply wiring 21 and the power supply wiring 25, the signal wiring 24 and the signal wiring 29, the other end of the clock wiring 23 and the other end of the clock wiring 28, and so on are each connected by the bump 3.

Figure 12:
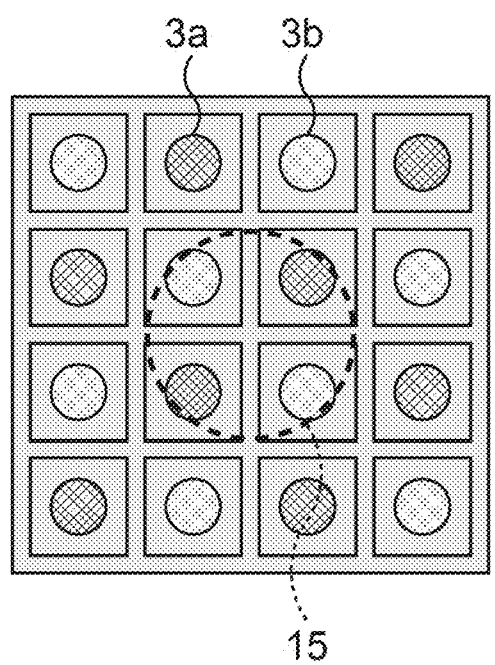
FIG. 12 is a schematic plan view illustrating an arrangement example of micro-bumps.

Each bump 3a connecting the signal wirings 24 and 29 and each bump 3b connecting the power supply wirings 21 and 25 are arranged alternately in a staggered pattern as illustrated in FIG. 12, for example.

When the PLL circuit is provided in the second semiconductor die 2 in the same manner as the logic circuits such as the flip-flop circuits like FIG. 5 or FIG. 8 above, no problem is caused because power supply is performed in the same manner as the logic circuits. The main configuration of the clock tree structure is provided in the first semiconductor die 1, and thus, it is necessary to connect an output signal from the PLL circuit to the first semiconductor die 1.

Figure 13A:
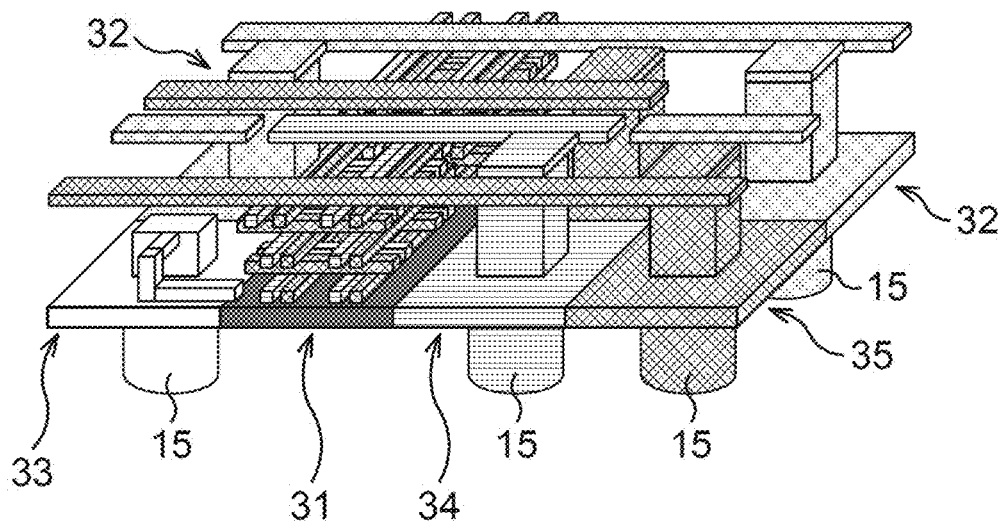
FIG. 13A and FIG. 13B are schematic views each illustrating a configuration around a PLL circuit in the semiconductor die.
Figure 13B:
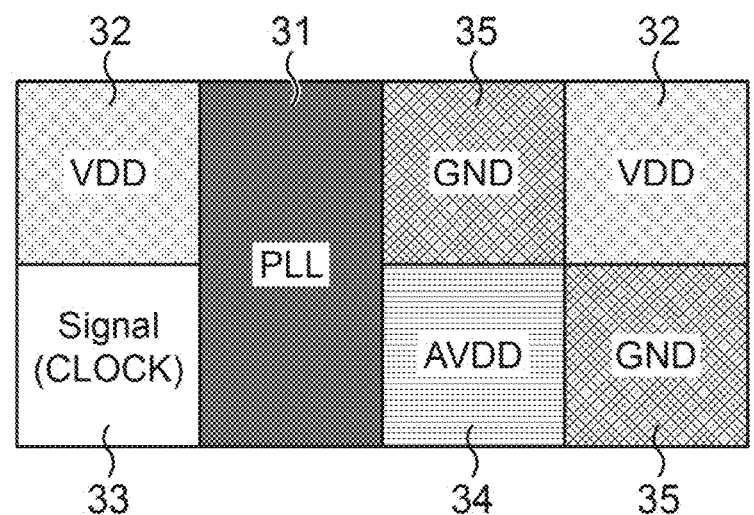

When the PLL circuit is provided in the first semiconductor die 1 in the same manner as the first part of the clock tree structure like FIG. 7 or FIG. 10 above, it is impossible to provide through electrodes in a place where the PLL circuit is arranged. In this case, the periphery around the PLL circuit in the first semiconductor die 1 is configured as illustrated in FIG. 13A and FIG. 13B, for example. FIG. 13A is a schematic perspective view, and FIG. 13B is a schematic plan view.

In the first semiconductor die 1, the through electrodes 15 are connected to a VDD wiring 32, a clock wiring 33, an analog power supply (AVDD) wiring 34, and a GND wiring 35 except a PLL circuit 31. In this case, the AVDD wiring 34 unnecessary for the second semiconductor die 2 is not connected to an upper power supply wiring (power plane).

In the semiconductor device according to this embodiment, the Face to Face structure is employed. When a Face to Back structure is employed, for example, through electrodes need to be provided in a connection path between the first semiconductor die and the second semiconductor die to be likely to affect a timing calculation of a signal delay, for example, or the like. By employing the Face to Face structure, the through electrodes that make additional capacities or the like to occur in the connection path are not needed when the first semiconductor die 1 and the second semiconductor die 2 are connected by the micro bumps or the like.

In the semiconductor device according to this embodiment, the first part being the main configuration of the clock tree structure is provided in the first semiconductor die 1. In the second semiconductor die 2, the logic circuit and the second part being the remaining portion of the clock tree structure are provided, and the logic circuit and the second part are electrically connected. The first part and the second part are electrically connected via the bumps 3. The configuration of the major portion of the clock tree structure is the first part, and the configuration of the second part is smaller than that of the first part.

The portion of the clock tree structure provided in the second semiconductor die 2 is only the above-described second part, and thus the wiring congestion in the periphery around the logic circuit in the second semiconductor die 2 is improved. Furthermore, the first part being the major portion of the clock tree structure is provided in the first semiconductor die 1, and thus in the second semiconductor die 2, the effect of crosstalk or the like on signal integrity, which is caused by a clock signal to the logic circuit, is very small. Therefore, the shield wirings that have to be provided in the second semiconductor die 2 are reduced, leading to a significant improvement in wiring congestion. Thereby, the degree of freedom of a wiring structure of the logic circuit in the second semiconductor die 2 increases. Further, since the main structure of the first semiconductor die 1 is the first part of the clock tree structure, a heat source hardly exists in the first semiconductor die 1 and consideration for temperature in the first semiconductor die 1 is no longer needed. By employing the above-described configuration, a high-performance semiconductor device that achieves high-density three-dimensional packaging is fabricated.

In the case where a configuration in which a large number of logic circuits such as flip-flop circuits are not provided in the first semiconductor die 1 is employed in the semiconductor device according to this embodiment, it becomes possible to build clock wirings having a very uniform structure, resulting in that it is possible to suppress clock skew as much as possible. Further, it becomes possible to fabricate the first semiconductor die 1 enabling diversion even though any logic circuit is arranged in the second semiconductor die 2.

In the semiconductor device according to this embodiment, when the configuration in which the first part 4A being the major portion of the clock tree structure 4 is provided in the first semiconductor die 1 is employed, the plural through electrodes 15 are arranged uniformly over the entire surface under the first element formation layer 12 of the first semiconductor die 1. By this configuration, sufficient power is supplied to the first semiconductor die 1 and the second semiconductor die 2. Since a large number of the through electrodes 15 are provided over the entire surface under the first element formation layer 12, a packaging region in the first element formation layer 12 is limited, but it is possible to secure a region sufficient for packaging the first part 4A of the clock tree structure 4.

(Manufacturing Method of the Stacked Semiconductor Device)

Next, there will be explained manufacturing methods of the stacked semiconductor device according to this embodiment.

—Manufacturing Method 1—

Figure 14A:
FIG. 14A to FIG. 14E are schematic cross-sectional views illustrating a manufacturing method 1 of the stacked semiconductor device according to the first embodiment in order of processes.
Figure 14B:
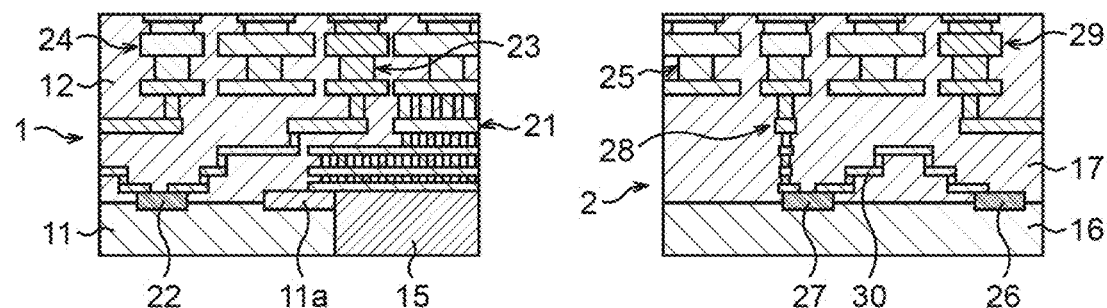
Figure 14C:
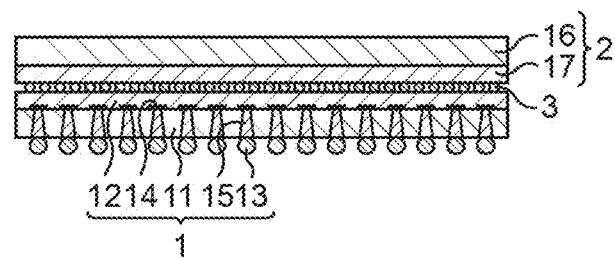
Figure 14D:
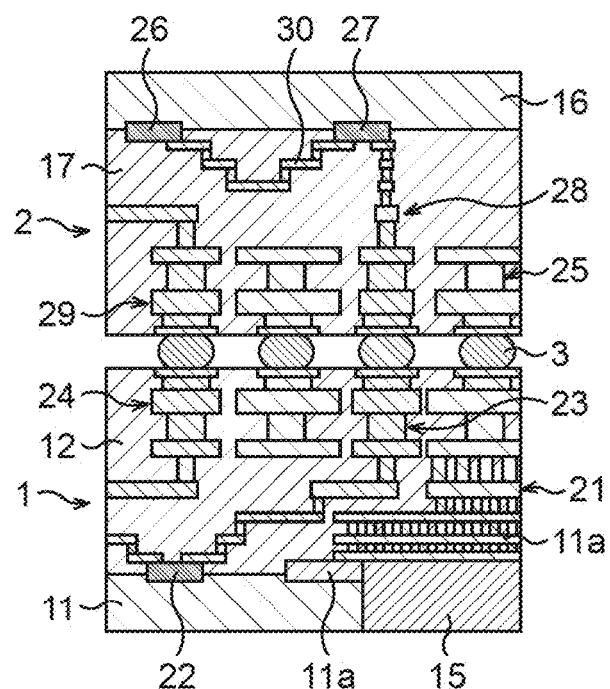

FIG. 14A to FIG. 14E are schematic cross-sectional views illustrating a manufacturing method 1 of the stacked semiconductor device according to the first embodiment in order of processes. FIG. 14B is partial enlarged views of cross sections of the first and second semiconductor dies in FIG. 14A, and FIG. 14D is a partial enlarged view of a cross section of the first and second semiconductor dies in FIG. 14C.

First, as illustrated in FIG. 14A, the first semiconductor die 1 and the second semiconductor die 2 are formed.

In the first semiconductor die 1, the first element formation layer 12 is formed on the first semiconductor substrate 11, and in the rear surface of the first semiconductor substrate 11, the through electrodes 15 that penetrate the first semiconductor substrate 11 to be connected to the connection pads of the first element formation layer 12 are formed. On the rear surface of the first semiconductor substrate 11, the bumps 13 such as C4 bumps are connected to the through electrodes 15 respectively.

In the first element formation layer 12, the power supply wiring 21, the first part of the clock tree structure, and the signal wiring 24 are formed as illustrated in FIG. 14B. In FIG. 14B, the clock macro 22 and the signal wiring 23 are illustrated representatively as the first part of the clock tree structure. The power supply wiring 21 is connected to the through electrodes 15.

In the second semiconductor die 2, the second element formation layer 17 is formed on the second semiconductor substrate 16.

In the second element formation layer 17, the power supply wiring 25, the second part of the clock tree structure, the signal wiring 29, and the clock wiring 30 are formed as illustrated in FIG. 14B. In FIG. 14B, the flip-flop circuit 26, the clock macro 27, the clock wiring 28, and the clock wiring 30 are illustrated representatively as the second part of the clock tree structure.

Subsequently, as illustrated in FIG. 14C, the first semiconductor die 1 and the second semiconductor die 2 are connected Face to Face.

More specifically, the front surface of the second semiconductor die 2 is connected to the front surface of the first semiconductor die 1 by the bumps 3 such as micro-bumps. At this time, as illustrated in FIG. 14D, the power supply wiring 21 and the power supply wiring 25, the signal wiring 24 and the signal wiring 29, and the first part and the second part of the clock tree structure (the clock wiring 23 and the clock wiring 28 in the example in FIG. 14D) are each connected by the bump 3. Here, the first part and the second part of the clock tree structure are electrically connected via the bumps 3, to then form the clock tree structure ranging from the first semiconductor die 1 to the second semiconductor die 2.

Figure 14E:
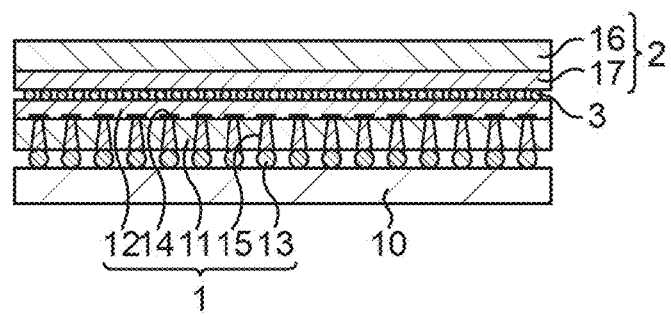

Subsequently, as illustrated in FIG. 14E, the semiconductor device formed of the first semiconductor die 1 and the second semiconductor die 2 is connected to the package substrate 10.

More specifically, the semiconductor device formed of the first semiconductor die 1 and the second semiconductor die 2 is provided on the package substrate 10 to be connected thereto by the bumps 13 such as C4 bumps provided on the rear surface of the first semiconductor die 1.

In this manner, the stacked semiconductor device is formed.

—Manufacturing Method 2—

Figure 15A:
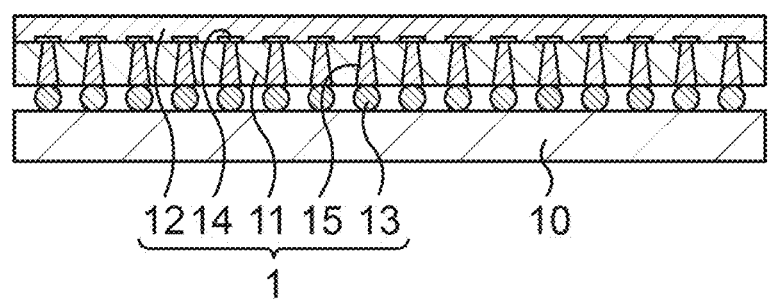
FIG. 15A and FIG. 15B are schematic cross-sectional views illustrating a manufacturing method 2 of the stacked semiconductor device according to the first embodiment in order of processes.
Figure 15B:
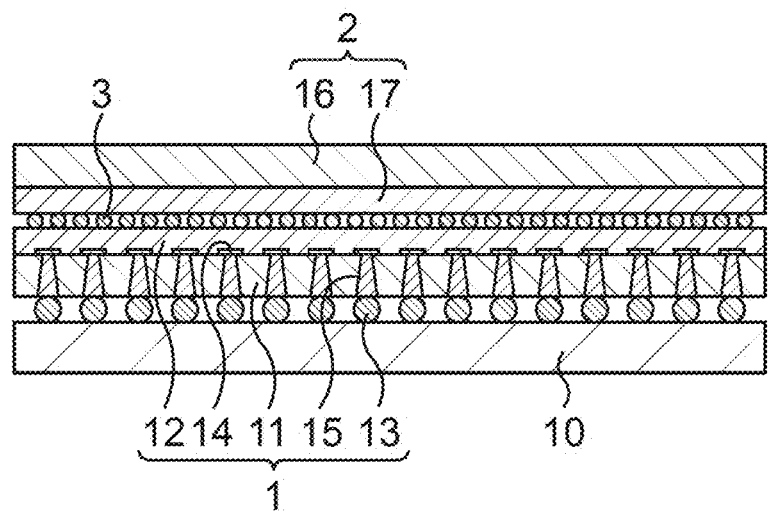

FIG. 15A and FIG. 15B are schematic cross-sectional views illustrating a manufacturing method 2 of the stacked semiconductor device according to the first embodiment in order of processes.

First, as illustrated in FIG. 15A, the first semiconductor die 1 is connected to the package substrate 10.

More specifically, the first semiconductor die 1 is provided on the package substrate 10 to be connected thereto by the bumps 13 such as C4 bumps provided on the rear surface of the first semiconductor die 1.

Subsequently, as illustrated in FIG. 15B, the second semiconductor die 2 is connected Face to Face to the first semiconductor die 1.

More specifically, the front surface of the second semiconductor die 2 is connected to the front surface of the first semiconductor die 1 by the bumps 3 such as micro-bumps. At this time, the first part of the clock tree structure provided in the first element formation layer 12 of the first semiconductor die 1 and the second part of the clock tree structure provided in the second element formation layer 17 of the second semiconductor die 2 are electrically connected via the bumps 3, to then configure the clock tree structure ranging from the first semiconductor die 1 to the second semiconductor die 2.

In this manner, the stacked semiconductor device is formed.

As explained above, according to this embodiment, in the semiconductor die stacked structure, the wiring congestion of the second semiconductor die including the logic circuit provided therein is improved, and the high-performance semiconductor device enabling high-density three-dimensional packaging is fabricated.

Second Embodiment

In this embodiment, there is disclosed a configuration in which a self-diagnosis circuit for clock signals and so on are added to the clock tree structure of the semiconductor device according to the first embodiment.

In the semiconductor device according to the first embodiment, the clock wirings are connected to the second semiconductor die 2 from the first semiconductor die 1 via the bumps 3, and thus there is a possibility that a connection failure occurs at the bumps 3 connecting the first and second semiconductor dies 1 and 2. In order to cope with this situation, a redundant circuit and a self-diagnosis circuit for clock signals, and a check enable signal generation circuit are provided.

Figure 16:
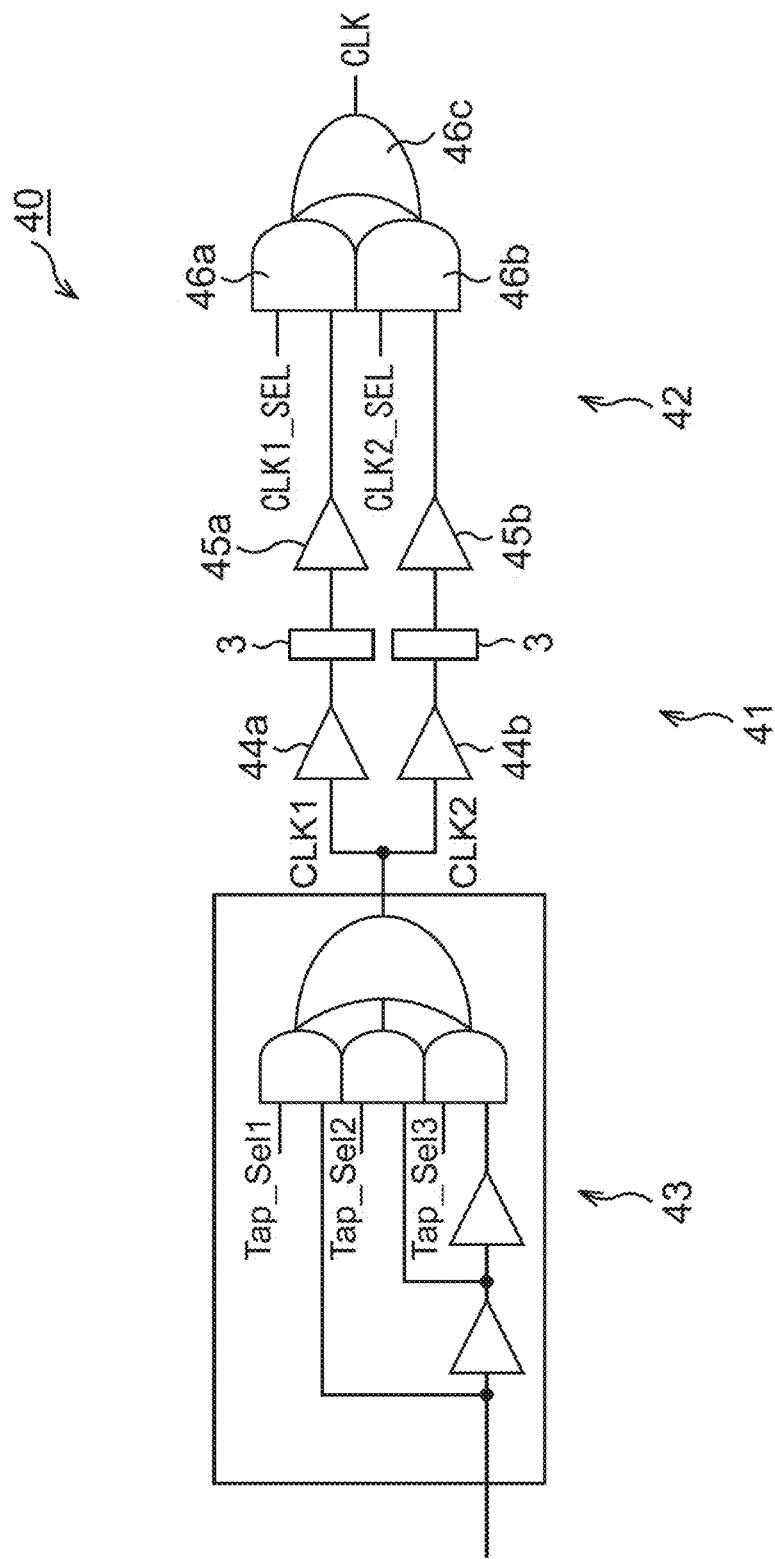
FIG. 16 is a schematic view illustrating one example of a redundant circuit for clock signals to be added in a second embodiment.

FIG. 16 is a schematic view illustrating one example of the redundant circuit for clock signals to be added in the second embodiment.

A redundant circuit 40 is to make all clock signals connecting the first semiconductor die 1 and the second semiconductor die 2 redundant and doubly propagate clock signals (CLK1, CLK2).

The redundant circuit 40 includes: a first configuration unit 41 to be provided in the first semiconductor die 1; and a second configuration unit 42 to be provided in the second semiconductor die 2 across the bumps 3. The redundant circuit 40 includes a tap controller 43 that adjusts a clock delay at the rear stage of the first configuration unit 41. The first configuration unit 41 includes buffer circuits 44a, 44b for CLK1, CLK2. The second configuration unit 42 includes: buffer circuits 45a, 45b for CLK1, CLK2; an AND circuit 46a that receives inputs of CLK1 and a later-described selection signal (CLK1_SEL) of CLK1; and an AND circuit 46b that receives inputs of CLK2 and a later-described selection signal (CLK2_SEL) of CLK2. Further, an OR circuit 46c connected to the AND circuits 46a, 46b is provided, from which a clock signal (CLK) is output.

Figure 17A:
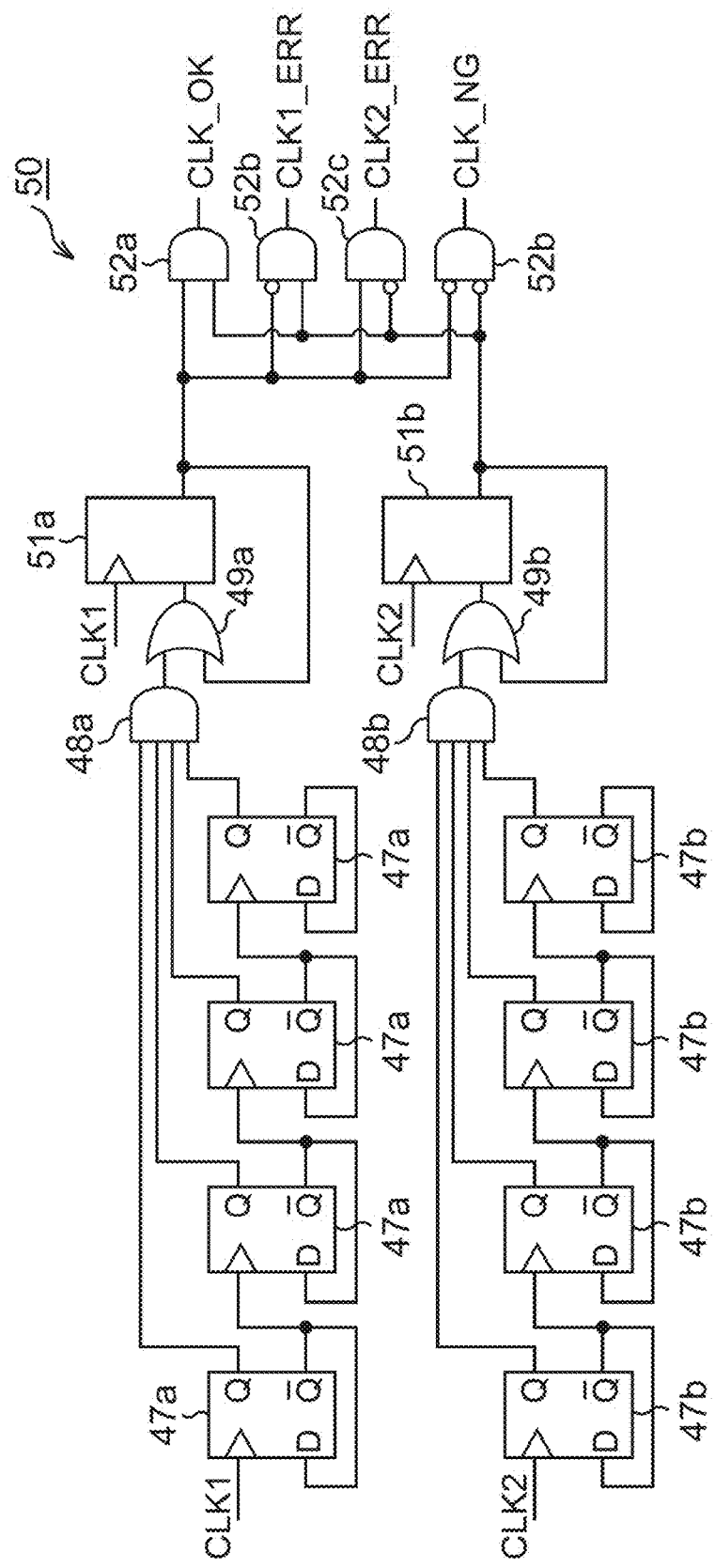
FIG. 17A and FIG. 17B are schematic views illustrating one example of a self-diagnosis circuit for clock signals to be added in the second embodiment.
Figure 17B:
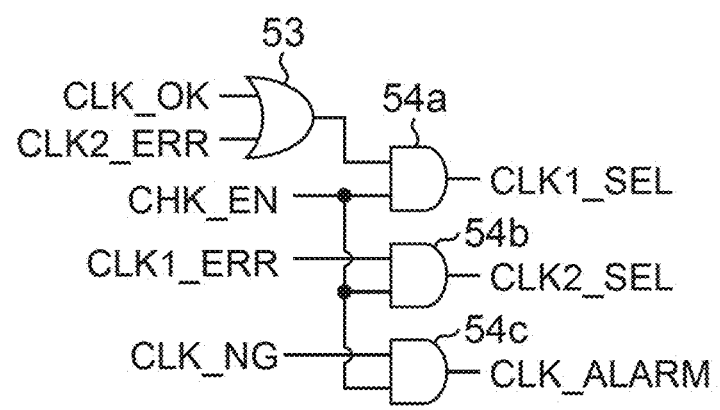

FIG. 17A and FIG. 17B are schematic views illustrating one example of the self-diagnosis circuit for clock signals to be added in the second embodiment.

A self-diagnosis circuit 50 is provided in the second semiconductor die 2. As illustrated in FIG. 17A, on the CLK1-input side, a plurality of flip-flop circuits 47a, an AND circuit 48a, an OR circuit 49a, and a flip-flop circuit 51a are provided. On the CLK2-input side, similarly, a plurality of flip-flop circuits 47b, an AND circuit 48b, an OR circuit 49b, and a flip-flop circuit 51b are provided. The plural flip-flop circuits 47a and the AND circuit 48a configure a pulse counter (or an adder). The plural flip-flop circuits 47b and the AND circuit 48b configure a pulse counter (or an adder). It is determined as no problem as long as the pulse counter (or the adder) is operated and then is operated up to a certain region. When a connection failure occurs at the bumps 3, the pulse counter (or the adder) does not operate, and thus determination is possible. Further, AND circuits 52a, 52b, 52c, and 52d that receive inputs of outputs from the flip-flop circuits 51a, 51b are provided. A signal (CLK_OK) indicating that CLK1, 2 are both normal is output from the AND circuit 52a. A signal (CLK1_ERR) indicating the CLK1 is an error is output from the AND circuit 52b. A signal (CLK2_ERR) indicating that CLK2 is an error is output from the AND circuit 52c. A signal (CLK_NG) indicating that CLK1, 2 both are an error is output from the AND circuit 52d.

As illustrated in FIG. 17B, in the self-diagnosis circuit 50, an OR circuit 53, and AND circuits 54a, 54b, and 54c are provided. CLK_OK from the AND circuit 52a and CLK2_ERR from the AND circuit 52c are input to the OR circuit 53. An output from the OR circuit 53 and a later-described check enable signal (CHK_EN) are input to the AND circuit 54a, and CLK1_SEL is output from the AND circuit 54a. CLK1_ERR from the AND circuit 52b and CHK_EN are input to the AND circuit 54b, and CLK2_SEL is output from the AND circuit 54b. CLK_NG from the AND circuit 52d and CHK_EN are input to the AND circuit 54c, and a signal (CLK_ALARM) warning that CLK1, 2 both are an error is output from the AND circuit 54c. CLK1_SEL and CLK2_SEL are input to the AND circuits 45a, 46b in the redundant circuit 40 respectively.

Figure 18A:
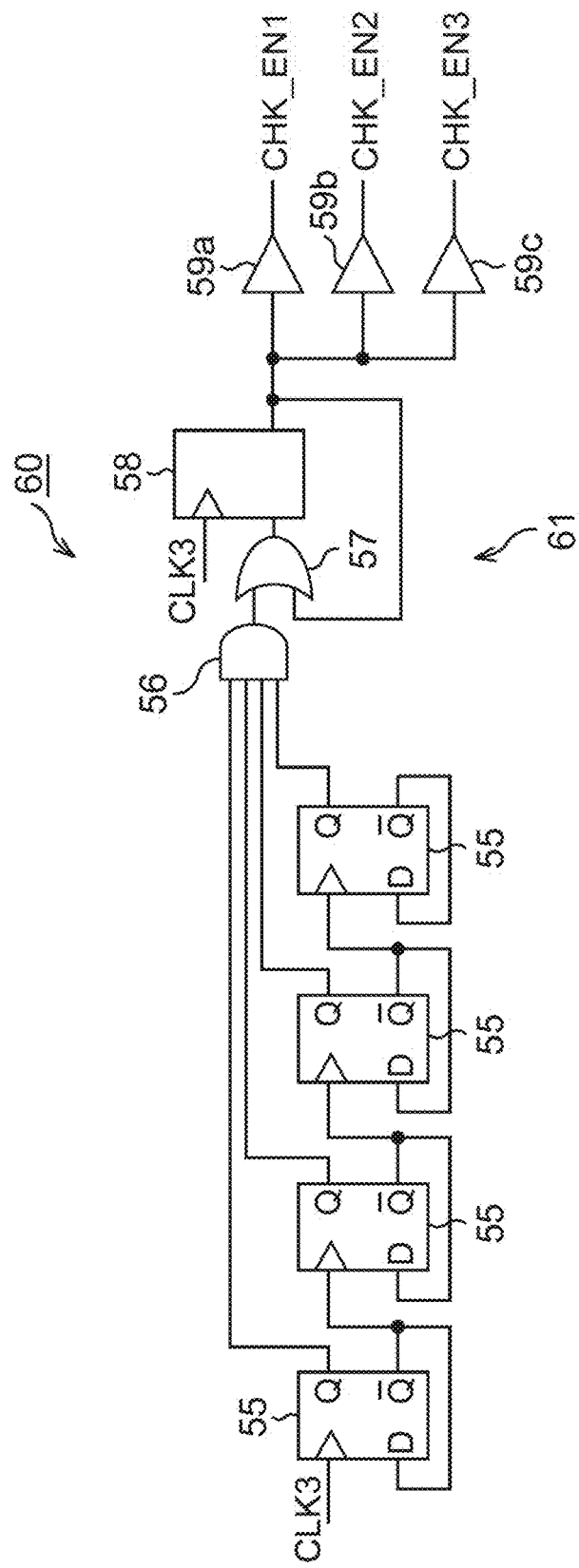
FIG. 18A and FIG. 18B are schematic views illustrating one example of a check enable signal generation circuit to be added in the second embodiment.
Figure 18B:
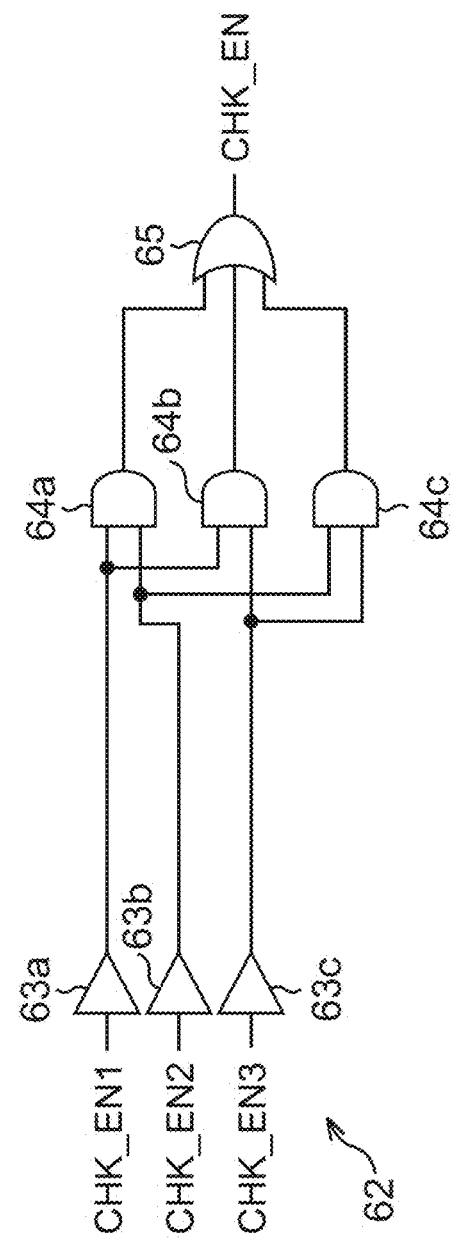

FIG. 18A and FIG. 18B are schematic views illustrating one example of the check enable signal generation circuit to be added in the second embodiment.

A check enable signal generation circuit 60 includes: a former-stage part 61 illustrated in FIG. 18A provided in the first semiconductor die 1; and a latter-stage part 62 illustrated in FIG. 18B provided in the second semiconductor die 2.

As illustrated in FIG. 18A, in the initial stage of the former-stage part 61, there are provided a plurality of flip-flop circuits (or adders) 55 receiving an input of CLK3 (similar to CLK1, CLK2 in FIG. 16) from a specific place of the clock tree final-stage configuration of the first semiconductor die 1, an AND circuit 56, an OR circuit 57, and a flip-flop circuit 58. There are provided buffer circuits 59a, 59b, and 59c each receiving an input of an output from the flip-flop circuit 58. A first check enable signal (CHK_EN1) is output from the buffer circuit 59a, a second check enable signal (CHK_EN2) is output from the buffer circuit 59b, and a third check enable signal (CHK_EN3) is output from the buffer circuit 59c.

As illustrated in FIG. 18B, in the latter-stage part 62, buffer circuits 63a, 63b, and 63c, AND circuits 64a, 64b, and 64C, and an OR circuit 65 are provided. CHK_EN1, CHK_EN2, and CHK_EN3 are input to the buffer circuits 63a, 63b, and 63c respectively. CHK_EN1 and CHK_EN2 are input to the AND circuit 64a, CHK_EN1 and CHK_EN3 are input to the AND circuit 64b, and CHK_EN2 and CHK_EN3 are input to the AND circuit 64c. In the OR circuit 65, outputs from the AND circuits 64a, 64b, and 64c are decided by majority to output the check enable signal (CHK_EN). CHK_EN is input to the AND circuits 54a, 54b, and 54c in the self-diagnosis circuit 50.

Figure 19:
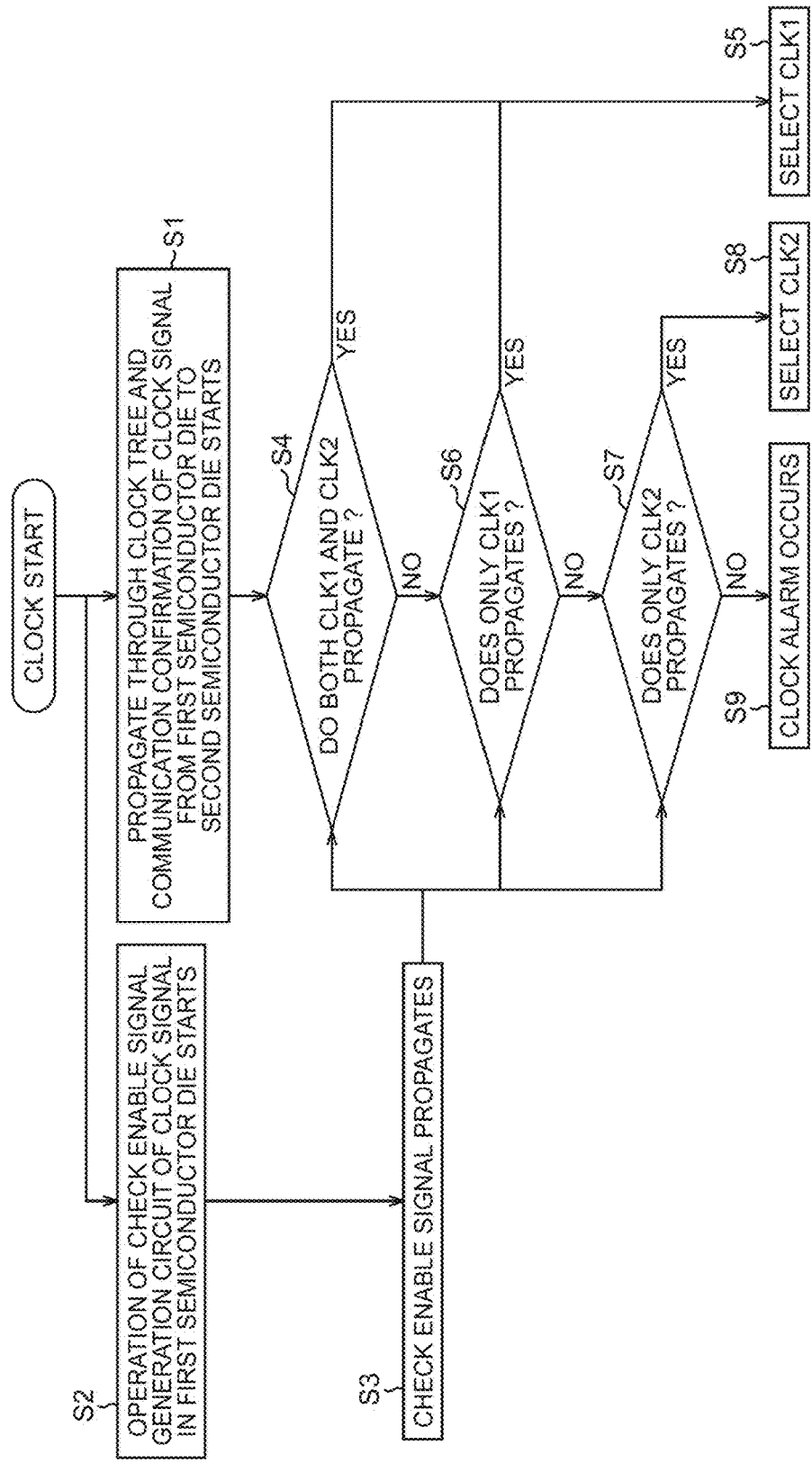
FIG. 19 is a view illustrating a diagnosis flow of clock signals by the self-diagnosis circuit, and the like added in the second embodiment.

FIG. 19 is a view illustrating a diagnosis flow of clock signals by the self-diagnosis circuit and the like added in the second embodiment.

In this diagnosis flow, the redundant circuit 40 and the self-diagnosis circuit 50 are driven to start communication confirmation of a clock signal from the first semiconductor die 1 to the second semiconductor die 2 of the clock tree structure (Step S1)

In parallel with Step S1, the check enable signal generation circuit 60 is driven (Step S2) to propagate CHK_EN (Step S3).

In the self-diagnosis circuit 50, whether CLK1 and CLK2 are propagated or not is determined (Step S4). In the case where propagation of both CLK1 and CLK2 is confirmed, CLK1 is selected (Step S5) to output CLK1_SEL. In the case where propagation of both CLK1 and CLK2 is not confirmed, whether only CLK1 is propagated or not is first determined (Step S6). In the case where propagation of only CLK1 is confirmed, CLK1 is selected (Step S5) to output CLK1_SEL. In the case where propagation of CLK1 is not confirmed, whether only CLK2 is propagated or not is determined (Step S7). In the case where propagation of only CLK2 is confirmed, CLK2 is selected (Step S8) to output CLK2_SEL. The case where propagation of CLK2 is not confirmed either indicates that CLK1 and CLK2 both are not propagated, and thus CLK_ALARM is output (Step S9).

As explained above, according to this embodiment, in the semiconductor die stacked structure, the wiring congestion of the second semiconductor die including the logic circuit provided therein is improved, and the high-performance semiconductor device enabling high-density three-dimensional packaging is fabricated.

Further, the self-diagnosis circuit and the like for clock signals are added to the clock tree structure, thereby resulting in improvements in clock signal reliability and yield.

Third Embodiment

In this embodiment, there will be disclosed configurations with reinforced power supply wirings of the first semiconductor die in the semiconductor devices according to the first (and second) embodiments.

Figure 20:
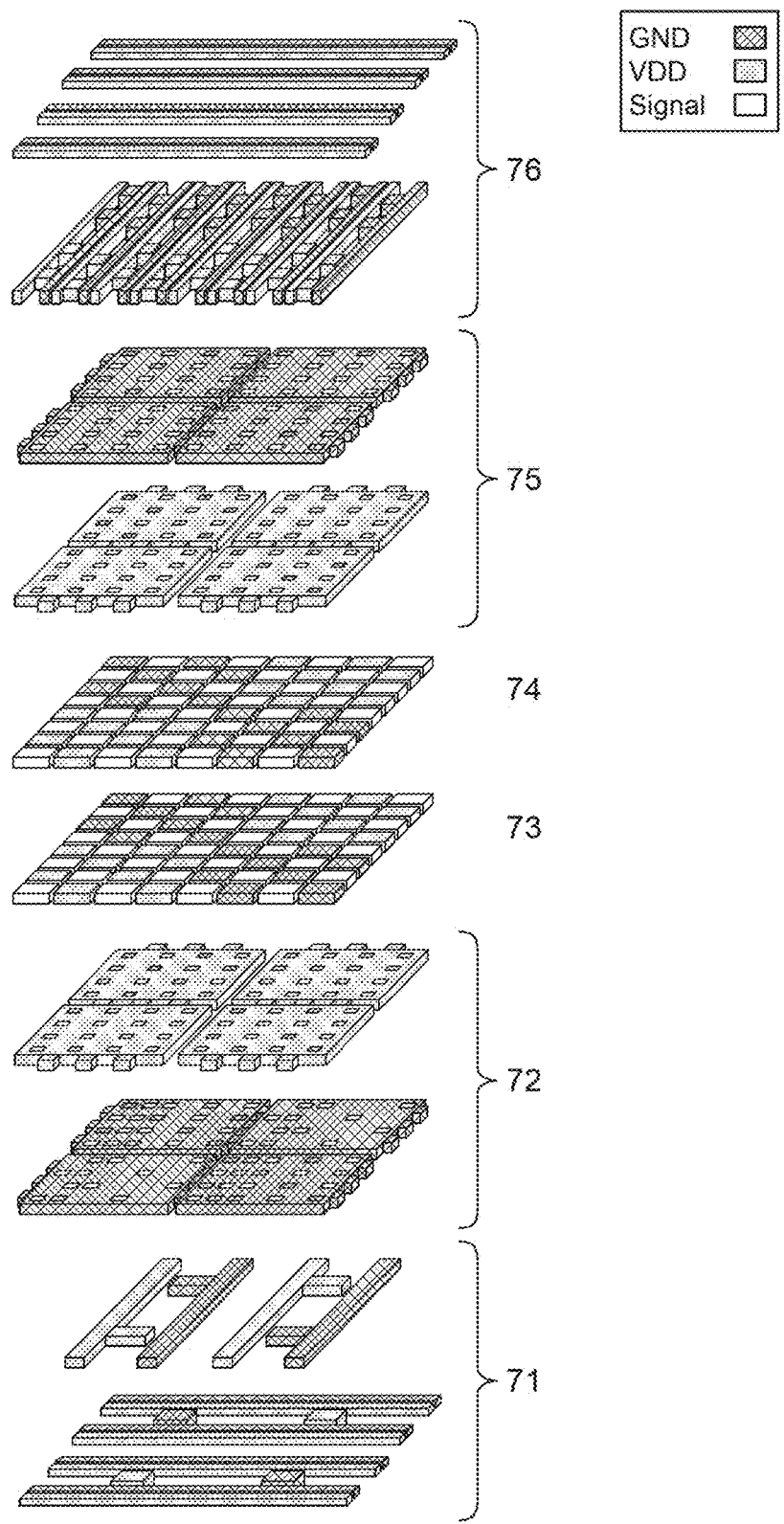
FIG. 20 is a schematic perspective view illustrating a power supply wiring pattern composition in a comparative example of a semiconductor device in a third embodiment.

FIG. 20 is a schematic perspective view illustrating a power supply wiring pattern composition in a comparative example of a semiconductor device according to a third embodiment.

In the comparative example, as for power supply wiring patterns of a GND wiring and a VDD wiring and a signal wiring pattern, in the first semiconductor die, a main power mesh 71 made of two layers, for example, a power plane 72 made of two layers each divided into four parts, for example, and a pad 73 are stacked sequentially. In the second semiconductor die, a pad 74, a power plane 75 made of two layers each divided into four parts, for example, and a main power mesh 76 made of two layers, for example, are stacked sequentially. In both the first and second semiconductor dies, a sub-power mesh having a striped mesh structure, which is thinner and has narrower pitches than the main power mesh, is added, and the entire power supply wiring structure is built. In the second semiconductor die, the power supply wiring pattern in the comparative example is provided, thereby failing to provide a general wiring in a portion of the power plane 75. Even the portion of the main power mesh 76 has a limitation in a region where a general wiring can be provided.

In the semiconductor device according to the first embodiment, the first part occupying a large portion of the clock circuit is provided in the first semiconductor die, and the remaining second part is provided in the second semiconductor die. Accordingly, it is relatively easy to reinforce the part, of the power supply wiring pattern, to be provided in the first semiconductor die.

Figure 21:
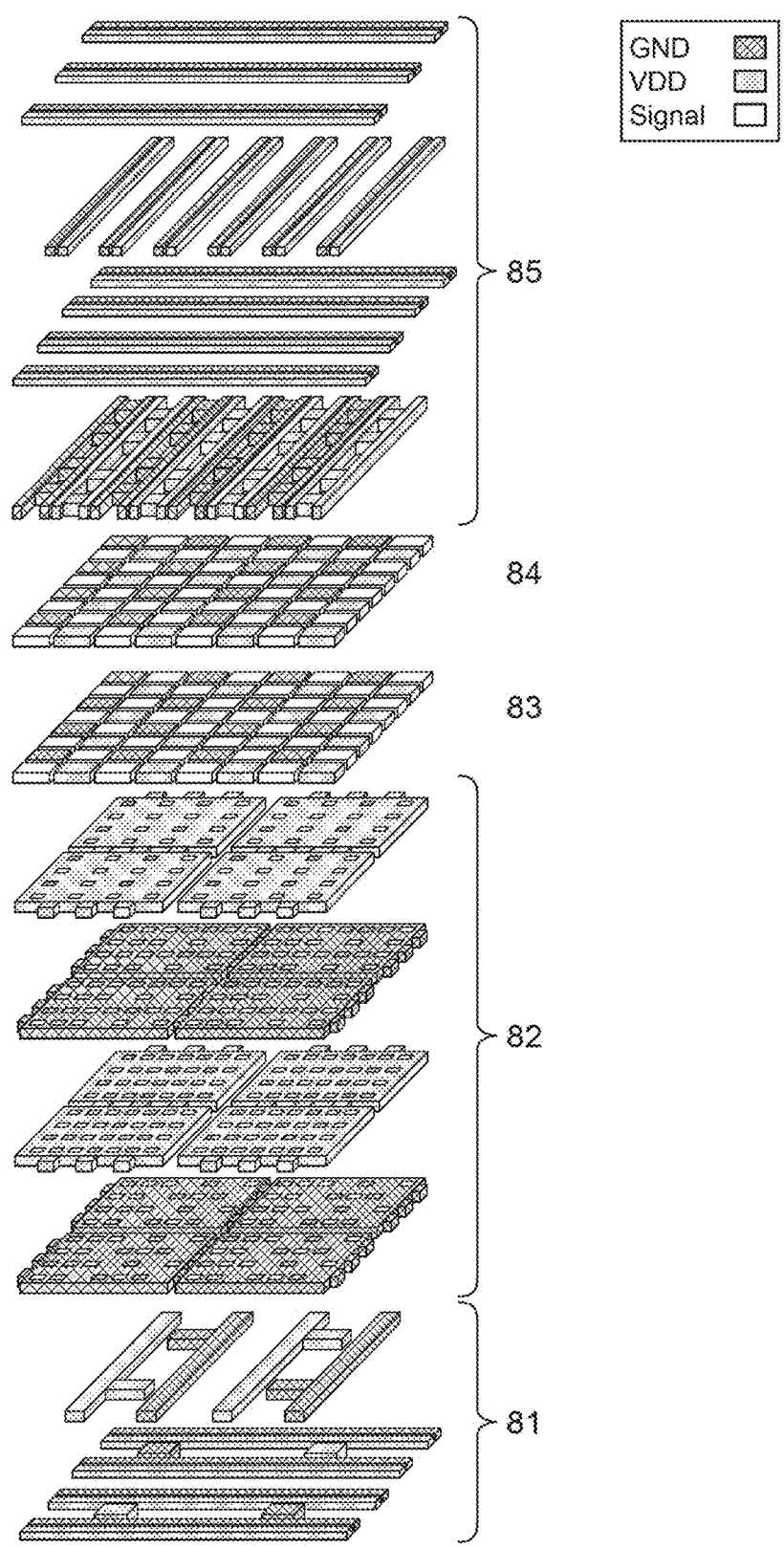
FIG. 21 is a schematic perspective view illustrating a power supply wiring pattern composition in the semiconductor device according to the third embodiment.

FIG. 21 is a schematic perspective view illustrating a power supply wiring pattern composition in the semiconductor device according to the third embodiment.

In this embodiment, as for the power supply wiring patterns of the GND wiring and the VDD wiring and the signal wiring pattern, in the first semiconductor die, a main power mesh 81 made of four layers, for example, a power plane 82 made of four layers each divided into four parts, for example, and a pad 83 are stacked sequentially. In the second semiconductor die, a pad 84 and a main power mesh 85 made of four layers, for example, are stacked sequentially. In this manner, the power plane to be provided in the first semiconductor die is set to, for example, double the comparative example, thereby making it possible to change the power plane in the second semiconductor die to a power mesh. This enables a general wiring to pass through also a portion of the main power mesh 85, resulting in an improvement in degree of freedom of wiring arrangement. Here, the pads 83, 84 are each changed to a striped structure from a staggered structure, and thereby the part, of the power supply wiring pattern, in the second semiconductor die can be made to have a more efficient structure.

As explained above, according to this embodiment, in the semiconductor die stacked structure, the wiring congestion of the second semiconductor die including the logic circuit provided therein is improved, and the high-performance semiconductor device enabling high-density three-dimensional packaging is fabricated.

Furthermore, the power supply wiring part, of the power supply wiring pattern, to be provided in the first semiconductor die is reinforced, and thereby the power supply wiring part to be provided in the second semiconductor die is simplified, the wiring congestion of the second semiconductor die is more alleviated, and higher-density three-dimensional packaging is enabled.

Fourth Embodiment

In this embodiment, there will be disclosed configurations each having a RAM macro provided in the semiconductor devices according to the first (to third) embodiments.

Configuration Example 1

Figure 22:
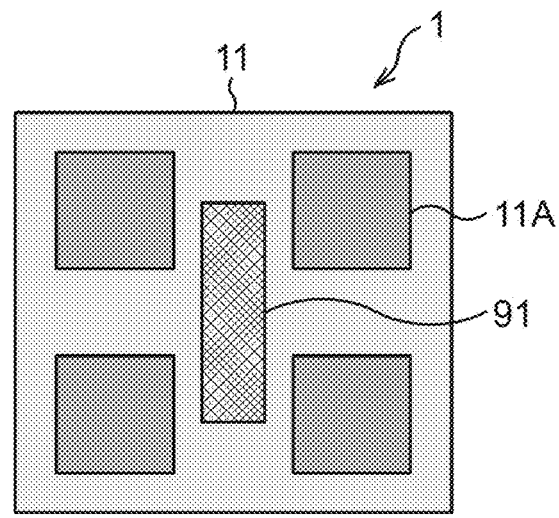
FIG. 22 is a schematic plan view illustrating a part of a first semiconductor die of a semiconductor device in a configuration example 1 according to a fourth embodiment.

FIG. 22 is a schematic plan view illustrating a part of a first semiconductor die in a semiconductor device in a configuration example 1 according to a fourth embodiment.

In the configuration example 1, a RAM macro 91 for a cache unit, history, or the like is arranged in a region between the electrode regions 11A for the through electrodes 15 in the first semiconductor die 1 of the semiconductor device. The RAM macro 91 is electrically connected to the logic circuit provided in the second semiconductor die via the micro-bumps. In this case, input/output of signals between the RAM macro 91 and the logic circuit are performed via the micro-bumps, and thus it becomes advantageous to delay design by narrowing each pitch between the micro-bumps.

Configuration Example 2

Figure 23:
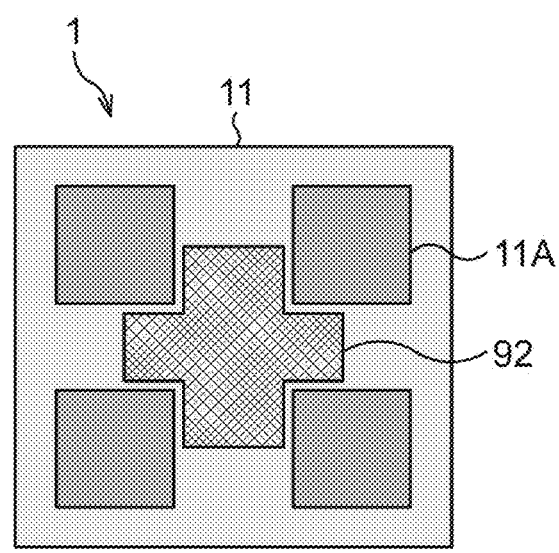
FIG. 23 is a schematic plan view illustrating a part of a first semiconductor die of a semiconductor device in a configuration example 2 according to the fourth embodiment.

FIG. 23 is a schematic plan view illustrating a part of a first semiconductor die in a semiconductor device in a configuration example 2 according to the fourth embodiment.

In the configuration example 2, a cross-shaped RAM macro 92 is arranged in a region between the electrode regions 11A for the through electrodes 15 in the first semiconductor die 1 of the semiconductor device considering a particularly enormous RAM macro. The RAM macro 92 is electrically connected to the logic circuit provided in the second semiconductor die via the micro-bumps.

Configuration Example 3

Figure 24:
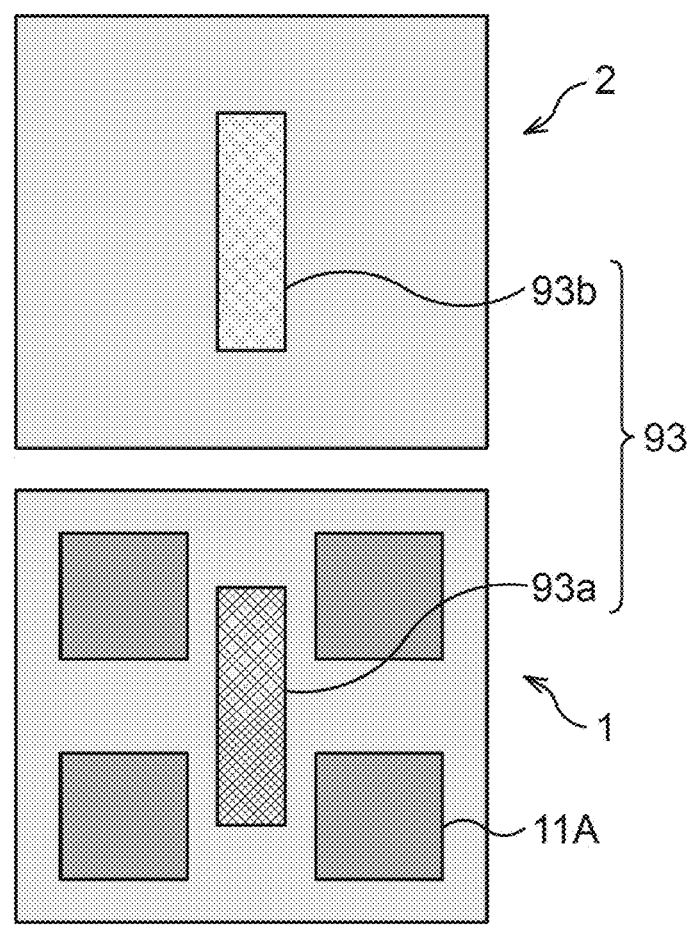
FIG. 24 is a schematic plan view illustrating a part of a semiconductor device in a configuration example 3 according to the fourth embodiment.

FIG. 24 is a schematic plan view illustrating a part of a semiconductor device in a configuration example 3 according to the fourth embodiment.

Figure 25:
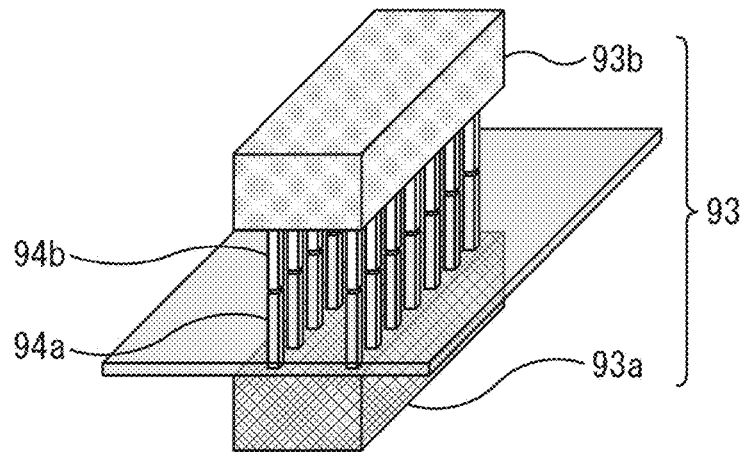
FIG. 25 is a schematic perspective view illustrating a configuration example of a RAM in the semiconductor device in the configuration example 3 according to the fourth embodiment.

In the configuration example 3, the RAM macro is divided into a first part and a second part, and the first part is provided in the first semiconductor die and the second part is provided in the second semiconductor die. Concretely, in the first semiconductor die 1, a first part 93a of a RAM macro 93 is arranged in a region between the electrode region 11A for the through electrodes 15. In the second semiconductor die 2, a second part 93b of the RAM macro 93 is arranged. In this semiconductor device, as illustrated in FIG. 25, an inter-RAM wiring 94a is connected to the first part 93a, an inter-RAM wiring 94b is connected to the second part 93b, and the inter-RAM wirings 94a and 94b are electrically connected via the micro-bumps, to thereby configure the RAM macro 93.

As explained above, according to this embodiment, in the semiconductor die stacked structure, the wiring congestion of the second semiconductor die including the logic circuit provided therein is improved, and the high-performance semiconductor device enabling high-density three-dimensional packaging is fabricated.

Furthermore, like the configuration examples 1, 2, the RAM macro is provided only in the first semiconductor die, and like the configuration example 3, the RAM macro is divided and arranged in the first semiconductor die and the second semiconductor die, and thereby the wiring congestion of the second semiconductor die is more alleviated. Therefore, it also becomes possible to increase the logic circuit to be provided in the second semiconductor die, and reduce the second semiconductor die by compressing a packaging area of the second semiconductor die.

Fifth Embodiment

In this embodiment, there will be disclosed configurations each having various circuits and wiring structures provided in the first semiconductor die in the semiconductor devices according to the first (to fourth) embodiments.

Configuration Example 1

Figure 26:
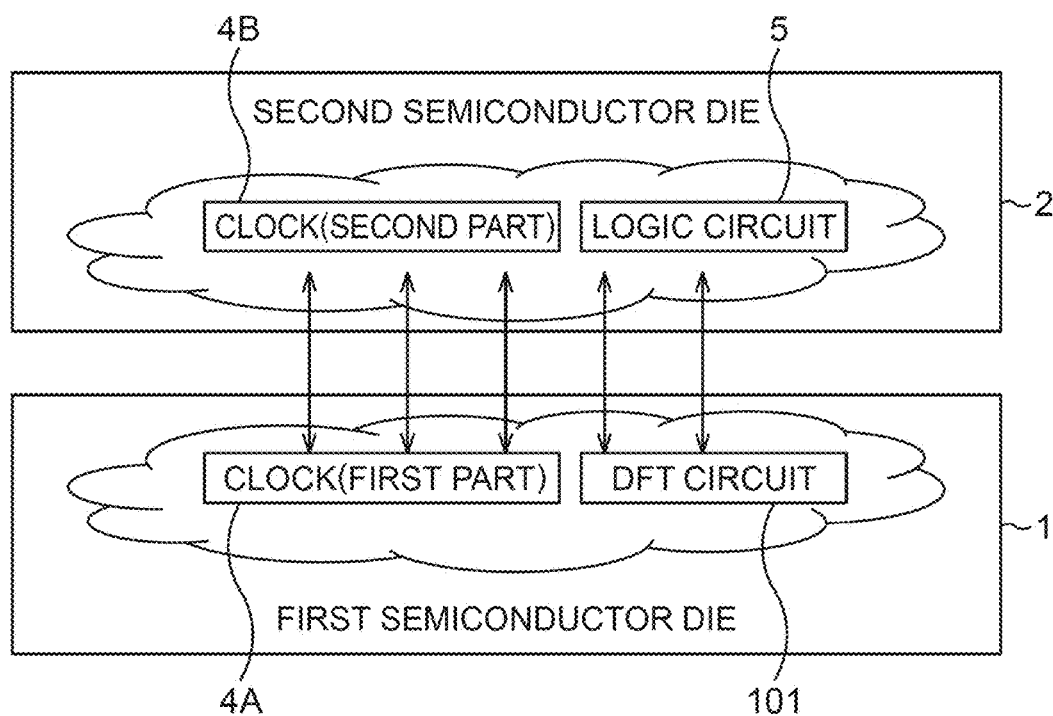
FIG. 26 is a schematic view illustrating an outline of a semiconductor device in a configuration example 1 according to a fifth embodiment.

FIG. 26 is a schematic view illustrating an outline of a semiconductor device in a configuration example 1 according to a fifth embodiment.

In the configuration example 1, a DFT (Design For Testability) circuit 101 is arranged in the first semiconductor die 1 of the semiconductor device. As explained in the first embodiment, the configuration in which the plural through electrodes are arranged in the entire surface of the semiconductor substrate is employed for the first semiconductor die. Therefore, it is difficult to provide a normal logic circuit in the first semiconductor die, which may impair the performance. Thus, in the configuration example 1, the DFT circuit 101 having low relevance to the logic circuit is provided in the first semiconductor die 1. In the DFT circuit 101, a large number of circuit configurations that do not need such a high-speed operation as the logic circuit exist, and thus it is relatively easy to package the DFT circuit 101 in the first semiconductor die different from the second semiconductor die having the logic circuit provided therein. Concretely, as illustrated in FIG. 26, the first part 4A of the clock tree structure and the DFT circuit 101 are provided in the first semiconductor die 1, and in the second semiconductor die 2, the second part 4B of the clock tree structure and the logic circuit 5 are arranged.

Incidentally, in each of the configuration examples of the fourth embodiment, a DFT circuit such as a memory BIST (Build In Self Test), which is connected to the RAM macro, is also packaged in the first semiconductor die.

Configuration Example 2

Figure 27:
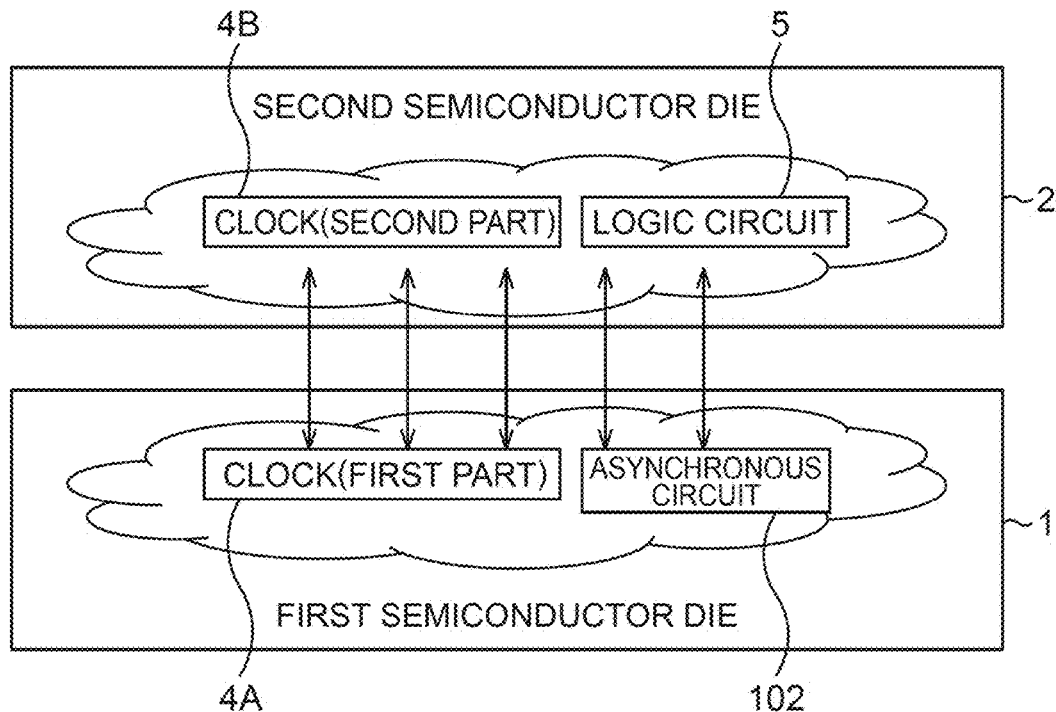
FIG. 27 is a schematic view illustrating an outline of a semiconductor device in a configuration example 2 according to the fifth embodiment.

FIG. 27 is a schematic view illustrating an outline of a semiconductor device in a configuration example 2 according to the fifth embodiment.

In the configuration example 2, an asynchronous circuit 102 such as a reset signal circuit is arranged in the first semiconductor die 1 of the semiconductor device. Concretely, as illustrated in FIG. 27, the first part 4A of the clock tree structure and the asynchronous circuit 102 are provided in the first semiconductor die 1, and in the second semiconductor die 2, the second part 4B of the clock tree structure and the logic circuit 5 are arranged.

Configuration Example 3

Figure 28:
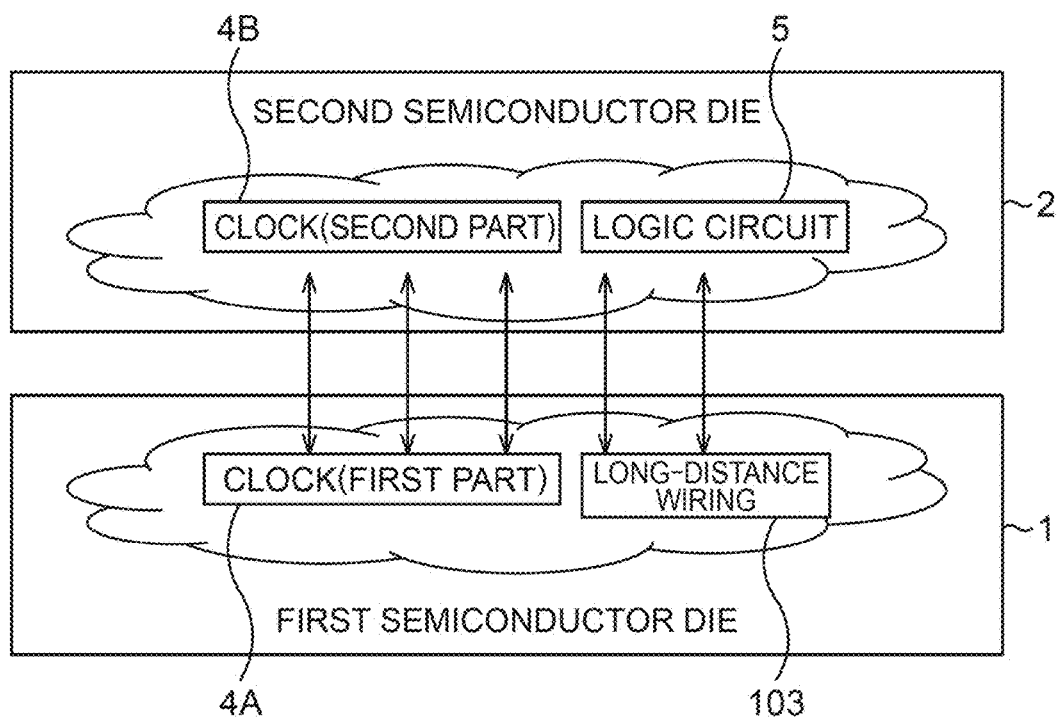
FIG. 28 is a schematic view illustrating an outline of a semiconductor device in a configuration example 3 according to the fifth embodiment.

FIG. 28 is a schematic view illustrating an outline of a semiconductor device in a configuration example 3 according to the fifth embodiment.

In the configuration example 3, a long-distance wiring (and its repeater) 103 are arranged in the first semiconductor die 1 of the semiconductor device. Concretely, as illustrated in FIG. 28, the first part 4A of the clock tree structure and the long-distance wiring 103 are provided in the first semiconductor die 1, and in the second semiconductor die 2, the second part 4B of the clock tree structure and the logic circuit (including a driver and a receiver of the long-distance wiring) are arranged.

The long-distance wiring 103 hardly runs parallel with other general wirings, and thus is not easily affected by crosstalk noise. The long-distance wiring 103 is provided in the first semiconductor die 1 together with the first part 4A occupying a large portion of the clock tree structure. There exists a sufficient region for providing the long-distance wiring 103 in the first semiconductor die 1, and thus it is conceivable that no problem is caused in terms of the arrangement of the long-distance wiring 103.

Configuration Example 4

Figure 29:
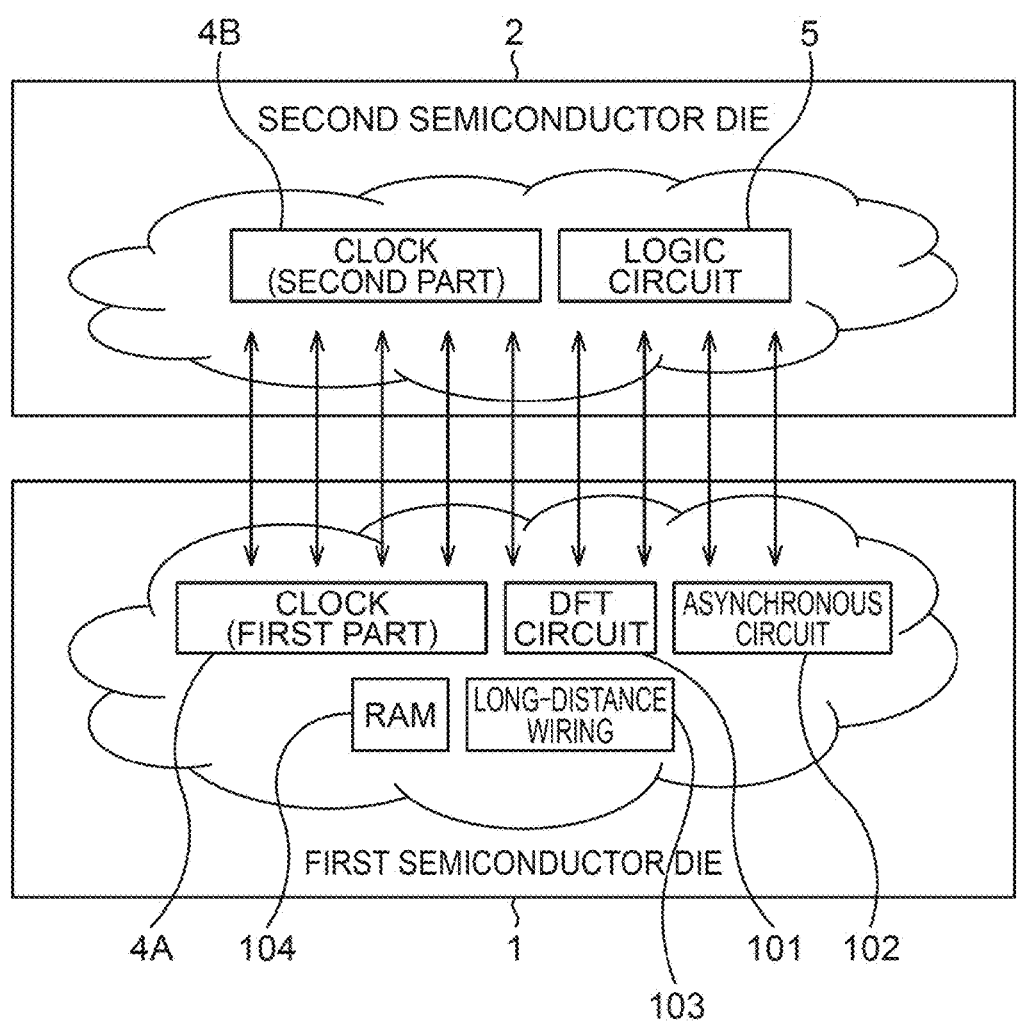
FIG. 29 is a schematic view illustrating an outline of a semiconductor device in a configuration example 4 according to the fifth embodiment.

FIG. 29 is a schematic view illustrating an outline of a semiconductor device in a configuration example 4 according to the fifth embodiment.

In the configuration example 4, in the first semiconductor die 1 of the semiconductor device, the DFT circuit 101, the asynchronous circuit 102, the long-distance wiring 103, and the RAM 104 (such as, for example, the RAM macro 91 in FIG. 22) are provided. Concretely, as illustrated in FIG. 29, the first part 4A of the clock tree structure, the DFT circuit 101, the asynchronous circuit 102, the long-distance wiring 103, and the RAM 104 are arranged in the first semiconductor die 1. In the second semiconductor die 2, the second part 4B of the clock tree structure and the logic circuit 5 are arranged.

As explained above, according to this embodiment, in the semiconductor die stacked structure, the wiring congestion of the second semiconductor die including the logic circuit provided therein is improved, and the high-density three-dimensional packaging is enabled.

Furthermore, the DFT circuit 101, the asynchronous circuit 102, the long-distance wiring 103, the RAM 104, and the like are appropriately provided in the first semiconductor die 1, and thereby the wiring congestion of the second semiconductor die 2 is alleviated and the high-performance semiconductor device enabling higher-density three-dimensional packaging is fabricated.

In one aspect, the wiring congestion is improved, and a high-performance semiconductor device enabling high-density three-dimensional packaging is fabricated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
a first semiconductor that comprises, in a clock tree with buffers connected in plural stages, the buffers each supplying a clock signal to a logic circuit provided in the semiconductor device, the second-stage buffer to the Nth-stage buffer (N being an integer of 3 or more); and
a second semiconductor that comprises a logic circuit electrically connected to the Nth-stage buffer,
the Nth-stage buffer is connected to a clock mesh that supplies a clock signal to the logic circuit.

2. The semiconductor device according to claim 1, wherein the first semiconductor comprises the first-stage buffer in the clock tree.

3. The semiconductor device according to claim 1, wherein the first semiconductor comprises through electrodes that penetrate a semiconductor substrate that the first semiconductor comprises.

4. The semiconductor device according to claim 3, wherein the plural through electrodes are uniformly arranged in an entire lower surface of the first semiconductor.

5. The semiconductor device according to claim 3, wherein the first semiconductor comprises a power supply wiring to be connected to the through electrodes.

6. The semiconductor device according to claim 1, further comprising:
a diagnosis circuit that diagnoses a clock signal.

7. The semiconductor device according to claim 1, wherein the first semiconductor comprises a DFT circuit.

8. The semiconductor device according to claim 1, wherein the first semiconductor comprises an asynchronous circuit.

9. The semiconductor device according to claim 1, wherein the first semiconductor comprises a RAM.

10. A manufacturing method of a semiconductor device, comprising:
forming a first semiconductor that comprises, in a clock tree with buffers connected in plural stages, the buffers each supplying a clock signal to a logic circuit provided in the semiconductor, the second-stage buffer to the Nth-stage buffer (N being an integer of 3 or more);
stacking a second semiconductor that comprises a logic circuit to be electrically connected to the Nth-stage buffer on the first semiconductor; and
connecting the Nth-stage buffer to the logic circuit,
the Nth-stage buffer is connected to a clock mesh that supplies a clock signal to the logic circuit.

11. The manufacturing method of the semiconductor device according to claim 10, wherein the first semiconductor comprises the first-stage buffer in the clock tree.

12. The manufacturing method of the semiconductor device according to claim 10, wherein in the first semiconductor, through electrodes that penetrate a semiconductor substrate that the first semiconductor comprises are formed.

13. The manufacturing method of the semiconductor device according to claim 12, wherein the plural through electrodes are uniformly arranged in an entire lower surface of the first semiconductor.

14. The manufacturing method of the semiconductor device according to claim 12, wherein the first semiconductor comprises a power supply wiring to be connected to the through electrodes.

15. The manufacturing method of the semiconductor device according to claim 10, wherein the semiconductor device comprises a diagnosis circuit that diagnoses a clock signal.

16. The manufacturing method of the semiconductor device according to claim 10, wherein the first semiconductor comprises a DFT circuit.

17. The manufacturing method of the semiconductor device according to claim 10, wherein the first semiconductor comprises an asynchronous circuit.

18. The manufacturing method of the semiconductor device according to claim 10, wherein the first semiconductor comprises a RAM.

* * * * *